(12) United States Patent
Guler et al.

(10) Patent No.: US 12,713,691 B2
(45) Date of Patent: Aug. 18, 2026

(54) GATE CUT GRID ACROSS INTEGRATED CIRCUIT

(71) Applicant: Intel Corporation, Santa Clara, CA (US)

(72) Inventors: Leonard P. Guler, Hillsboro, OR (US); Sukru Yemenicioglu, Portland, OR (US); Mohit K. Haran, Forest Grove, OR (US); Shengsi Liu, Portland, OR (US); Robert Joachim, Beaverton, OR (US); Dan S. Lavric, Portland, OR (US); Stephen M. Cea, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 319 days.

(21) Appl. No.: 17/682,037

(22) Filed: Feb. 28, 2022

(65) Prior Publication Data

US 2023/0275085 A1 Aug. 31, 2023

(51) Int. Cl.

| | |
|---|---|
| ***H10D 84/83*** | (2025.01) |
| ***H10D 30/67*** | (2025.01) |
| ***H10D 62/10*** | (2025.01) |
| ***H10D 64/23*** | (2025.01) |

(52) U.S. Cl.

CPC ......... *H10D 84/83* (2025.01); *H10D 30/6735* (2025.01); *H10D 30/6757* (2025.01); *H10D 62/118* (2025.01); *H10D 64/258* (2025.01)

(58) Field of Classification Search

CPC ............... H10D 84/83; H10D 30/6735; H10D 30/6757; H10D 62/118; H10D 64/258

See application file for complete search history.

(56) References Cited

U.S. PATENT DOCUMENTS

| | | | | |
|---|---|---|---|---|
| 2021/0193828 A1* | 6/2021 | Cheng | .................. | H10D 84/834 |
| 2021/0343708 A1* | 11/2021 | Lichtenwalner | ....... | H10D 30/66 |
| 2022/0359506 A1* | 11/2022 | Ng | ..................... | H10D 84/0158 |
| 2023/0111003 A1* | 4/2023 | Fujita | ................ | H10D 84/0147 257/384 |

FOREIGN PATENT DOCUMENTS

| | | | |
|---|---|---|---|
| DE | 102020115785 A1 * | 6/2021 | ....... H01L 21/76224 |

* cited by examiner

*Primary Examiner* — Britt Hanley
*Assistant Examiner* — Casey Paul Boatman
(74) *Attorney, Agent, or Firm* — Arcane Law PLLC

(57) ABSTRACT

Techniques are provided herein to form an integrated circuit having a grid of gate cut structures such that a gate cut structure exists between pairs of semiconductor devices. In an example, neighboring semiconductor devices each include a semiconductor region extending between a source region and a drain region, and a gate structure extending over the semiconductor regions of the neighboring semiconductor devices. A gate cut structure is present between each pair of neighboring semiconductor devices thus interrupting the gate structure and isolating the gate of one semiconductor device from the gate of the other semiconductor device. Each of the gate cut structures may be formed at the same time in a grid-like pattern across the integrated circuit (or a portion thereof). Sidewall spacer structures on the sidewalls of the gate structure wrap around ends of each gate structure to form a given gate cut structure.

20 Claims, 14 Drawing Sheets

GATE CUT GRID ACROSS INTEGRATED CIRCUIT

FIELD OF THE DISCLOSURE

The present disclosure relates to integrated circuits, and more particularly, to gate cut structures.

BACKGROUND

As integrated circuits continue to scale downward in size, a number of challenges arise. For instance, reducing the size of memory and logic cells is becoming increasingly more difficult. Certain aspects of lithography technology can impose physical limits on how accurately certain structures can be aligned. Due to the high complexity of integrated circuit layouts, any structures that require additional masking processes or tight alignment tolerances yield possible points of failure for the device. Accordingly, there remain a number of non-trivial challenges with respect to forming such high-density semiconductor devices.

Figure 1A:
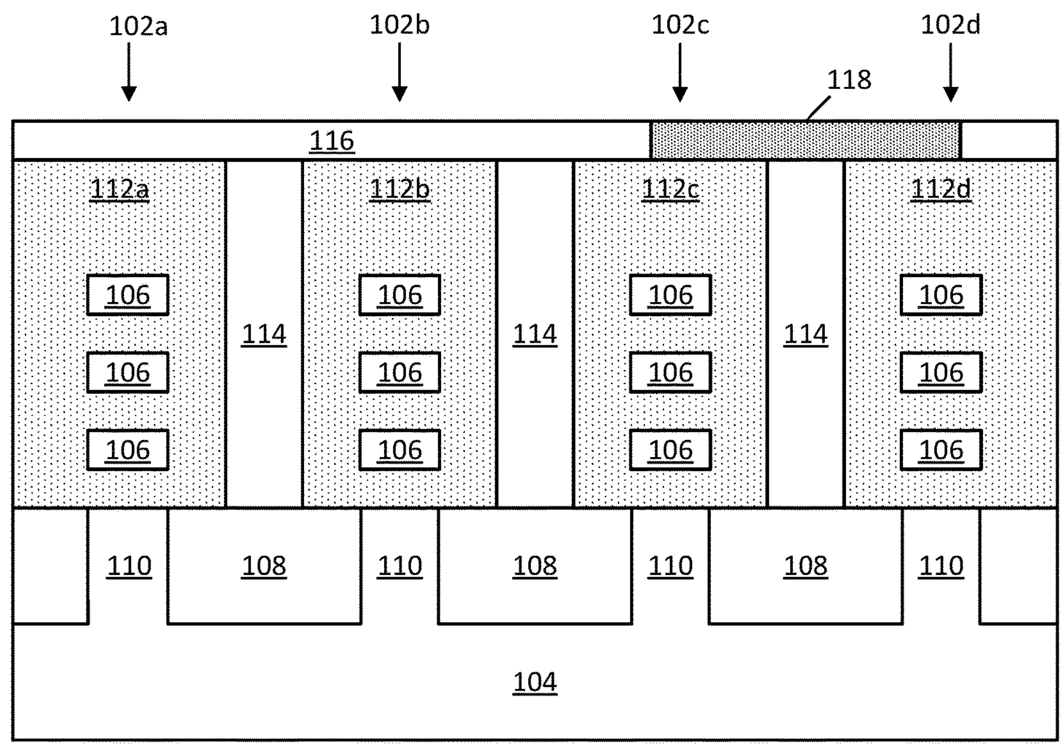
FIG. 1A is a cross-sectional view and FIG. 1B is a plan view of an integrated circuit including a grid-like pattern of gate cut structures between adjacent devices, in accordance with an embodiment of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles (e.g., some features may have tapered sidewalls and/or rounded corners), and some features may have surface topology or otherwise be non-smooth, given real world limitations of the processing equipment and techniques used.

DETAILED DESCRIPTION

Techniques are provided herein to form an integrated circuit having a grid of gate cut structures such that a gate cut structure exists between pairs of semiconductor devices. The techniques can be used in any number of integrated circuit applications and are particularly useful with respect to logic and memory cells, such as those cells that use finFETs or gate-all-around transistors (e.g., ribbonFETs and nanowire FETs). In an example, neighboring semiconductor devices each include a semiconductor region extending between a source region and a drain region, and a gate structure extending over the semiconductor regions of the neighboring semiconductor devices. In some such examples, a gate cut structure is present between each pair of neighboring semiconductor devices thus interrupting the gate structure and isolating the gate of one semiconductor device from the gate of the other semiconductor device. Each of the gate cut structures may be formed, for example, at the same time in a grid-like pattern across the integrated circuit, or in one or more portions of the integrated circuit. In an embodiment, conformal sidewall spacer structures on the sidewalls of the gate structures also wrap around ends of each gate structure to form a given gate cut structure. Numerous variations and embodiments will be apparent in light of this disclosure.

General Overview

As previously noted above, there remain a number of non-trivial challenges with respect to integrated circuit fabrication. In more detail, gate cut structures are sometimes provided between adjacent semiconductor devices to isolate first and second portions of a gate structure that crosses over each of the adjacent semiconductor devices. Accordingly, a gate cut structure can be used to isolate the gates of two devices from one another. Forming such structures can require numerous additional masking and etching processes that can compromise the integrity of the integrated circuit. Furthermore, standard gate cut structures are contained within the gate trench area, which can lead to potential shorting around the gate cut structures.

Thus, and in accordance with an embodiment of the present disclosure, techniques are provided herein to form a grid of gate cut structures across an integrated circuit (or a portion thereof) such that the structures are all formed at the same time between adjacent pairs of semiconductor devices. According to some such examples, forming gate cut structures between each device pair allows for a more streamlined masking and etching process to form the gate cut structures early in the fabrication process (e.g., prior to formation of the final gate structure). In an embodiment, each gate cut structure is formed from the merging of sidewall spacer structures around the ends of adjacent gate structures thus providing enhanced isolation between the gates on either side of the gate cut structure. An additional benefit to using the grid-like pattern of gate cut structures is the removal of dead space within each of the gate structures, which lowers parasitic capacitance across the integrated circuit.

According to an embodiment, an integrated circuit includes a plurality of semiconductor devices each having one or more semiconductor bodies extending in a first direction between a corresponding source region and a corresponding drain region, and a plurality of gate structures. Each of the gate structures extends lengthwise in a second direction different from the first direction across the one or more semiconductor bodies of a corresponding semiconductor device of the plurality of semiconductor devices. The integrated circuit also includes a plurality of dielectric barriers where each dielectric barrier is arranged between a different pair of collinear adjacent gate structures along the second direction.

According to another embodiment, an integrated circuit includes a first semiconductor device having a first semiconductor body extending in a first direction between a first source region and a first drain region, a second semiconductor device having a second semiconductor body extending in the first direction parallel to the first semiconductor body between a second source region and a second drain region, a first gate structure extending across the first semiconductor body in a second direction different from the first direction, a second gate structure extending across the second semiconductor body in the second direction, a first spacer structure along sidewalls of the first gate structure; and a second spacer structure along sidewalls of the second gate structure. In an example, the first and second spacer structures wrap around ends of the first gate structure and the second gate structure to form a gate cut structure between the first gate structure and the second gate structure.

According to another embodiment, a method of forming an integrated circuit includes: forming a plurality of fins comprising semiconductor material extending above a top surface of a dielectric layer, the plurality of fins each extending lengthwise in a first direction; forming a strip of sacrificial gate material over the plurality of fins, the strip of sacrificial gate material extending lengthwise in a second direction different from the first direction; forming a recess through the strip of sacrificial gate material between each adjacent pair of fins of the plurality of fins, thus creating collinear strips of sacrificial gate material; forming spacer structures on sidewalls of the collinear strips of sacrificial gate material such that the spacer structures also fill each of the recesses to form dielectric barriers between each adjacent pair of fins; and replacing the collinear strips of sacrificial gate material with gate structures.

The techniques can be used with any type of non-planar transistors, including finFETs (sometimes called double-gate transistors, or tri-gate transistors), or nanowire and nanoribbon transistors (sometimes called gate-all-around transistors), to name a few examples. The source and drain regions can be, for example, doped portions of a given fin or substrate, or epitaxial regions that are deposited during an etch-and-replace source/drain forming process. The dopant-type in the source and drain regions will depend on the polarity of the corresponding transistor. The gate structure can be implemented with a gate-first process or a gate-last process (sometimes called a replacement metal gate, or RMG, process), or any other gate formation process. Any number of semiconductor materials can be used in forming the transistors, such as group IV materials (e.g., silicon, germanium, silicon germanium) or group III-V materials (e.g., gallium arsenide, indium gallium arsenide).

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For instance, in some example embodiments, such tools may indicate the presence of gate cut structures between every adjacent pair of semiconductor devices of a given integrated circuit. In another example, such tools may be used to observe that one or more of the gate cut structures are formed from the sidewall spacer structures wrapping around ends of adjacent collinear gate structures. In some such cases, the gate cut structures may include dimpled or pinched-in regions, as will be explained in turn (such as shown in FIG. 6C).

It should be readily understood that the meaning of "above" and "over" in the present disclosure should be interpreted in the broadest manner such that "above" and "over" not only mean "directly on" something but also include the meaning of over something with an intermediate feature or a layer therebetween. Further, spatially relative terms, such as "beneath," "below," "lower," "above," "upper," "top," "bottom," and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the material has an element that is not in the other material.

Architecture

FIG. 1A is a cross sectional view taken across a plurality of semiconductor devices 102a-102d, according to an embodiment of the present disclosure. Each of semiconductor devices 102a-102d may be non-planar metal oxide semiconductor (MOS) transistors, such as tri-gate or gate-all-around (GAA) transistors, although other transistor topologies and types could also benefit from the techniques provided herein. The examples herein illustrate semiconductor devices with a GAA structure (e.g., having nanoribbons that extend between source and drain regions).

As can be seen, semiconductor devices 102a-102d are formed over a substrate 104. Any number of semiconductor devices can be formed on or over substrate 104, but four are used here as an example. Substrate 104 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material upon which transistors can be formed. Alternatively, the substrate can be a semiconductor-on-insulator substrate having a desired semiconductor layer over a buried insulator layer (e.g., silicon over silicon dioxide). Alternatively, the substrate can be a multilayer substrate or superlattice suitable for forming nanowires or nanoribbons (e.g., alternating layers of silicon and SiGe, or alternating layers indium gallium arsenide and indium phosphide). Any number of substrates can be used. In some embodiments, substrate 104 is removed from the backside and replaced with one or more backside interconnect layers to provide backside power and signal routing.

Each of semiconductor devices 102a-102d includes one or more nanoribbons 106 that extend parallel to one another along a direction between a source region and a drain region (e.g., into and out of the page in the cross-section view of FIG. 1A). Nanoribbons 106 are one example of semiconductor regions that extend between source and drain regions. The term nanoribbon may also encompass other similar shapes such as nanowires or nanosheets. The semiconductor material of nanoribbons 106 may be formed from substrate 104. In some embodiments, semiconductor devices 102a-102d may each include semiconductor regions in the shape of fins that can be, for example, native to substrate 104 (formed from the substrate itself), such as silicon fins etched from a bulk silicon substrate. Alternatively, the fins can be formed of material deposited onto an underlying substrate. In one such example case, a blanket layer of silicon germanium (SiGe) can be deposited onto a silicon substrate, and then patterned and etched to form a plurality of SiGe fins extending from that substrate. In another such example, non-native fins can be formed in a so-called aspect ratio trapping based process, where native fins are etched away so as to leave fin-shaped trenches which can then be filled with an alternative semiconductor material (e.g., group IV or III-V material). In still other embodiments, the fins include alternating layers of material (e.g., alternating layers of silicon and SiGe) that facilitates forming of the illustrated nanoribbons 106 during a gate forming process where one type of the alternating layers are selectively etched away so as to liberate the other type of alternating layers within the channel region, so that a gate-all-around (GAA) process can then be carried out. Again, the alternating layers can be blanket deposited and then etched into fins, or deposited into fin-shaped trenches.

As can further be seen, adjacent semiconductor devices are separated by a dielectric fill 108 that may include silicon oxide. Dielectric fill 108 provides shallow trench isolation (STI) between any adjacent semiconductor devices. Dielectric fill 108 can be any suitable dielectric material, such as silicon dioxide, aluminum oxide, or silicon oxycarbonitride.

Semiconductor devices 102a-102d each include a subfin region 110. According to some embodiments, subfin region 110 comprises the same semiconductor material as substrate 104 and is adjacent to dielectric fill 108. According to some embodiments, nanoribbons 106 (or other semiconductor structures) are present above the top surface of subfin region 110 and provide an active region for each transistor (e.g., the semiconductor region beneath the gate).

As noted above, nanoribbons 106 extend between a source region and a drain region. The source and drain regions are not shown in this particular cross-section. According to some embodiments, the source and drain regions are epitaxial regions that are provided on the ends of the fins or nanoribbons in an etch-and-replace process. In other embodiments one or both of the source and drain regions could be, for example, implantation-doped native portions of the fins or substrate. Any semiconductor materials suitable for source and drain regions can be used (e.g., group IV and group III-V semiconductor materials). The source and drain regions may include multiple layers such as liners and capping layers to improve contact resistance. In any such cases, the composition and doping of the source and drain regions may be the same or different, depending on the polarity of the transistors. In an example, for instance, one transistor is a p-type MOS (PMOS) transistor, and the other transistor is an n-type MOS (NMOS) transistor. Any number of source and drain configurations and materials can be used.

According to some embodiments, gate structures 112a-112d extend over nanoribbons 106 of corresponding semiconductor devices 102a-102d. It should be noted that one or more gate dielectric layers are also a part of each of gate structure 112a-112d around nanoribbons 106 and are not shown for clarity. Each of gate structures 112a-112d may include any sufficiently conductive material such as a metal, metal alloy, or doped polysilicon. In some embodiments, the gate structures 112a-112d include one or more workfunction metals around nanoribbons 106. In some embodiments, semiconductor devices 102a and 102b are p-channel devices that include a workfunction metal having titanium around its nanoribbons 106 and semiconductor devices 102c and 102d are n-channel devices that include a workfunction metal having tungsten around its nanoribbons 106. Gate structures 112a-112d may also include a fill metal or other conductive material around the workfunction metals to provide the whole gate electrode structure.

According to some embodiments, each gate structure 112a-112d is separated along the second direction by a different gate cut structure 114, which act like dielectric barriers between gate structures. The gate cut structures 114 effectively isolate the gate structures 112a-112d from one another to form electrically separate gates for each semiconductor device. In the illustrated example, three gate cut structures 114 are formed to electrically isolate each gate structure 112a-112d from one another.

Gate cut structures 114 may be formed from a sufficiently insulating material, such as a dielectric material. Example materials for gate cut structures 114 include silicon nitride, silicon oxide, or silicon oxynitride. According to some embodiments, gate cut structures 114 each has a width between about 10 nm and about 15 nm.

In some cases, the gates of two adjacent semiconductor devices may need to be connected together. Thus, according to some embodiments, a top dielectric layer 116 may be formed over gate structures 112a-112d and gate cut structures 114 and a shunt contact 118 may be formed between adjacent gate structures. Top dielectric layer 116 may be any suitable dielectric material, such as silicon oxide. Top dielectric layer 116 may be lithographically patterned to form an opening that exposes the top surfaces of one or more gate cut structures 114 and any adjacent gate structures. Shunt contact 118 includes any suitable conductive material formed within the opening to electrically connect two or more adjacent gate structures. In the illustrated example, shunt contact 118 is formed to connect gate structure 112c with gate structure 112d. Any number of similar shunt contacts may be formed across the integrated circuit to connect adjacent gates together as desired. In some examples, shunt contact 118 extends further to connect more than two adjacent gate structures together.

Figure 1B:
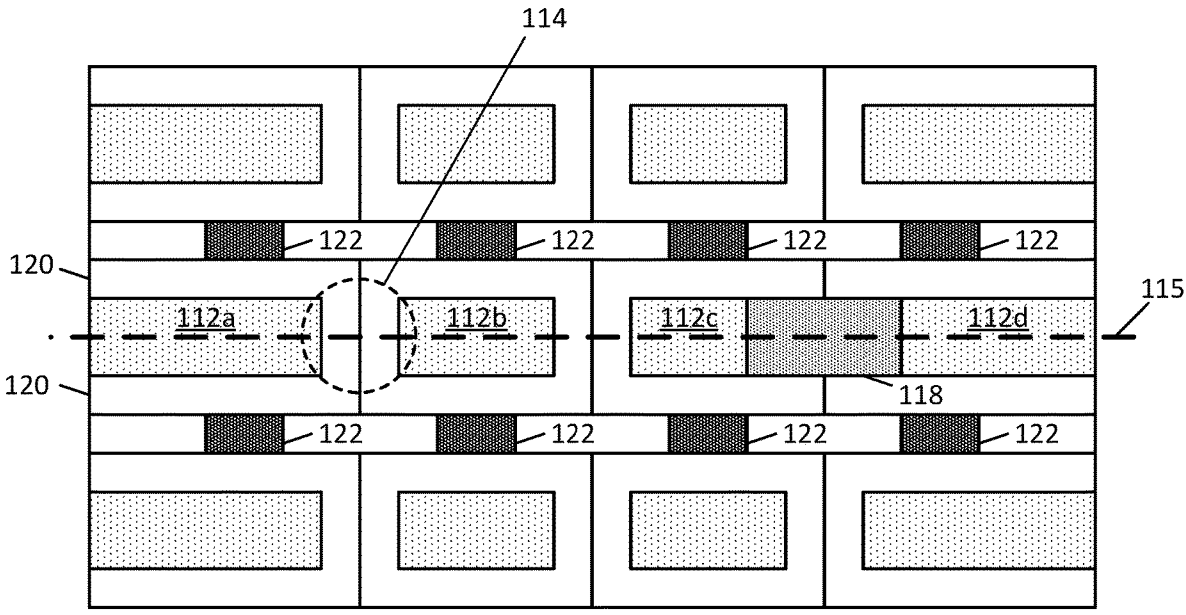

FIG. 1B illustrates a plan view of an integrated circuit that includes each of semiconductor devices 102a-102d. The dashed line identifies a plane 115 through which the cross-section of FIG. 1A is taken. Spacer structures 120 are provided along sidewalls of the various gate structures, such as gate structures 112a-112d, and may include any suitable dielectric material, such as silicon nitride or silicon oxynitride. According to some embodiments, spacer structures 120 also wrap around the ends of each of the gate structures to form gate cut structures 114. The grid-like arrangement of gate cut structures 114 can be seen in the plan view with gate cut structures 114 present between each adjacent pair of semiconductor devices each with its own gate structure. Shunt contact 118 is also seen connecting gate structure 112c with gate structure 112d (top dielectric layer 116 is omitted from this plan view to observe the structures below).

The various semiconductor regions of the semiconductor devices extend between source or drain regions 122. Any of source or drain regions 122 may act as either a source region or a drain region, depending on the application and dopant profile. Any semiconductor materials suitable for source and drain regions can be used (e.g., group IV and group III-V semiconductor materials) for any of the illustrated source or drains regions 122. In any such cases, the composition and doping of source or drain regions 122 may be the same or different, depending on the polarity of the transistors. In an example, for instance, semiconductor devices 102a and 102b are p-type MOS (PMOS) transistors having a high concentration of p-type dopants in the associated source or drain regions 122, and semiconductor devices 102c and 102d are n-type MOS (NMOS) transistors having a high concentration of n-type dopants in the associated source or drain regions 122. Any number of source and drain configurations and materials can be used.

Fabrication Methodology

FIGS. 2A-10A and 2B-10B are cross-sectional and plan views, respectively, that collectively illustrate an example process for forming an integrated circuit configured with self-aligned gate cut structures, in accordance with an embodiment of the present disclosure. FIGS. 2A-10A represent a cross-sectional view taken across plane 115 shown in FIG. 1B, while FIGS. 2B-10B represent the corresponding plan view across a portion of the integrated circuit. Each figure shows an example structure that results from the process flow up to that point in time, so the depicted structure evolves as the process flow continues, culminating in the structure shown in FIGS. 10A and 10B, which is similar to the structure shown in FIGS. 1A and 1B. Such a structure may be part of an overall integrated circuit (e.g., such as a processor or memory chip) that includes, for example, digital logic cells and/or memory cells and analog mixed signal circuitry. Thus, the illustrated integrated circuit structure may be part of a larger integrated circuit that includes other integrated circuitry not depicted. Example materials and process parameters are given, but the present disclosure is not intended to be limited to any specific such materials or parameters, as will be appreciated. Figures sharing the same number (e.g., FIGS. 2A and 2B) illustrate different views of the structure at the same point in time during the process flow.

Figure 2A:
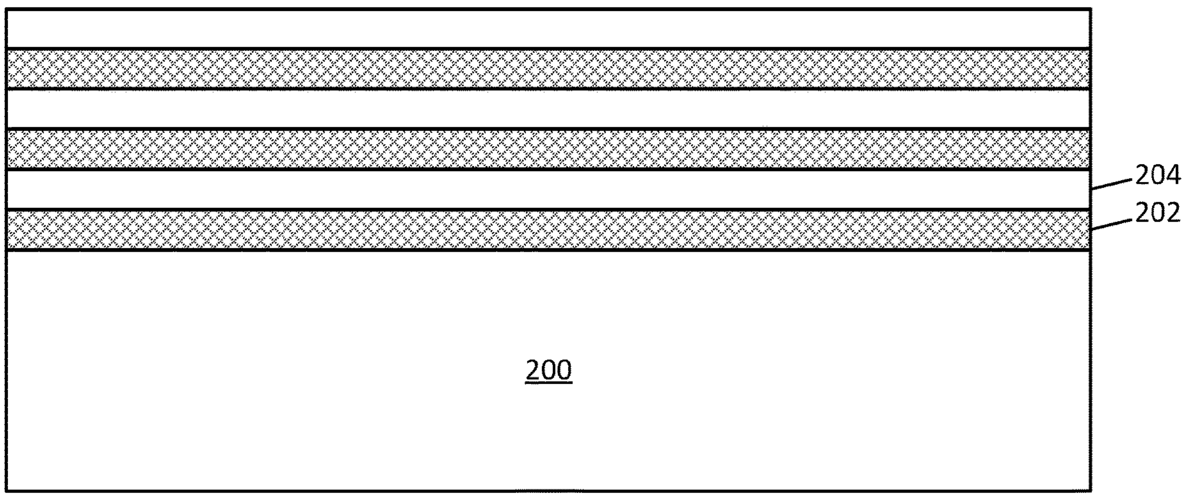
FIGS. 2A and 2B are cross-sectional and plan views, respectively, that illustrate one stage in an example process for forming an integrated circuit configured with a grid of gate cut structures, in accordance with an embodiment of the present disclosure.

FIG. 2A illustrates a cross-sectional view taken through a substrate 200 having a series of material layers formed over the substrate, according to an embodiment of the present disclosure. Alternating material layers may be deposited over substrate 200 including sacrificial layers 202 alternating with semiconductor layers 204. The alternating layers are used to form GAA transistor structures. Any number of alternating semiconductor layers 204 and sacrificial layers 202 may be deposited over substrate 200. The description above for substrate 104 applies equally to substrate 200.

According to some embodiments, sacrificial layers 202 have a different material composition than semiconductor layers 204. In some embodiments, sacrificial layers 202 are silicon germanium (SiGe) while semiconductor layers 204 include a semiconductor material suitable for use as a nanoribbon such as silicon (Si), SiGe, germanium, or III-V materials like indium phosphide (InP) or gallium arsenide (GaAs). In examples where SiGe is used in each of sacrificial layers 202 and in semiconductor layers 204, the germanium concentration is different between sacrificial layers 202 and semiconductor layers 204. For example, sacrificial layers 202 may include a higher germanium content compared to semiconductor layers 204. In some examples, semiconductor layers 204 may be doped with either n-type dopants (to produce a p-channel transistor) or p-type dopants (to produce an n-channel transistor).

Figure 2B:
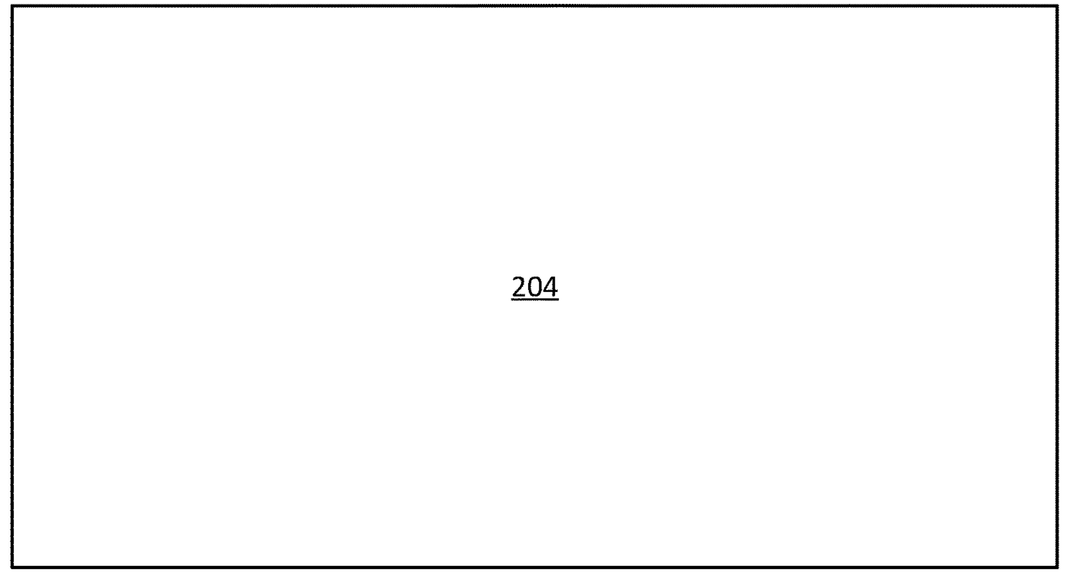

While dimensions can vary from one example embodiment to the next, the thickness of each sacrificial layer 202 may be between about 5 nm and about 20 nm. In some embodiments, the thickness of each sacrificial layer 202 is substantially the same (e.g., within 1-2 nm). The thickness of each of semiconductor layers 204 may be about the same as the thickness of each sacrificial layer 202 (e.g., about 5-20 nm). Each of sacrificial layers 202 and semiconductor layers 204 may be deposited using any known material deposition technique, such as chemical vapor deposition (CVD), plasma-enhanced chemical vapor deposition (PECVD), physical vapor deposition (PVD), or atomic layer deposition (ALD). FIG. 2B illustrates a plan view showing only the top-most deposited semiconductor layer 204, according to an embodiment.

Figure 3A:
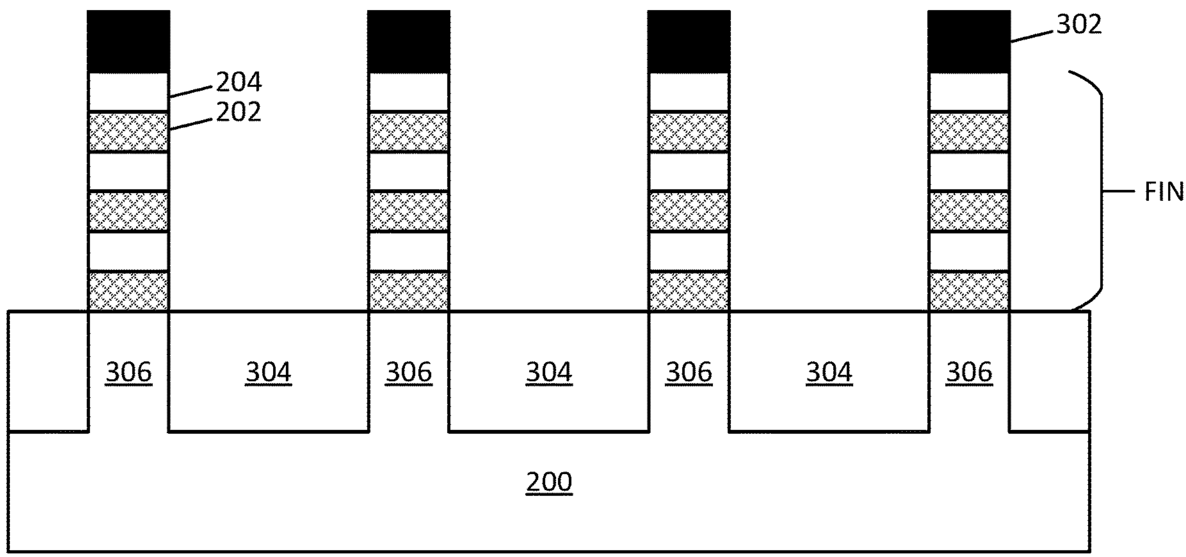
FIGS. 3A and 3B are cross-sectional and plan views, respectively, that illustrate another stage in the example process for forming an integrated circuit configured with a grid of gate cut structures, in accordance with an embodiment of the present disclosure.
Figure 3B:
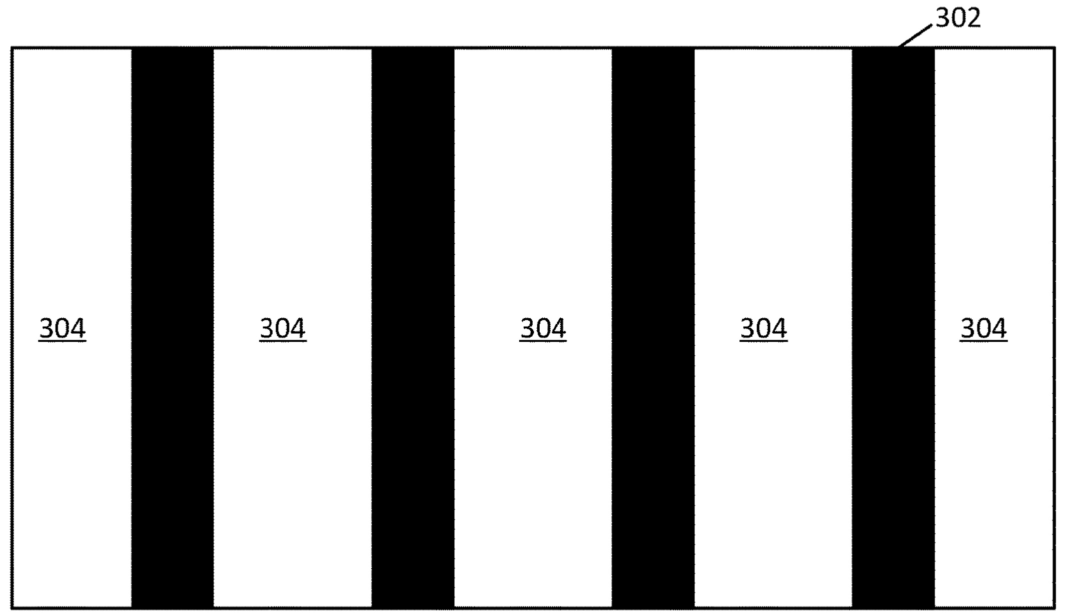

FIGS. 3A and 3B depict the cross-section and plan views of the structure shown in FIGS. 2A and 2B, respectively, following the formation of a cap layer 302 and the subsequent formation of fins beneath cap layer 302, according to an embodiment. Cap layer 302 may be any suitable hard mask material such as a carbon hard mask (CHM) or silicon nitride. Cap layer 302 is patterned into rows to form corresponding rows of fins from the alternating layer stack of sacrificial layers 202 and semiconductor layers 204.

According to some embodiments, an anisotropic etching process through the layer stack continues into at least a portion of substrate 200. The etched portion of substrate 200 may be filled with a dielectric layer 304 that acts as shallow trench isolation (STI) between adjacent fins. Dielectric layer 304 may be any suitable dielectric material such as silicon oxide. Subfin regions 306 represent remaining portions of substrate 200 between dielectric layer 304, according to some embodiments. FIG. 3B illustrates how dielectric layer 304 extends along the entire length of each of the fins, according to some embodiments.

Figure 4A:
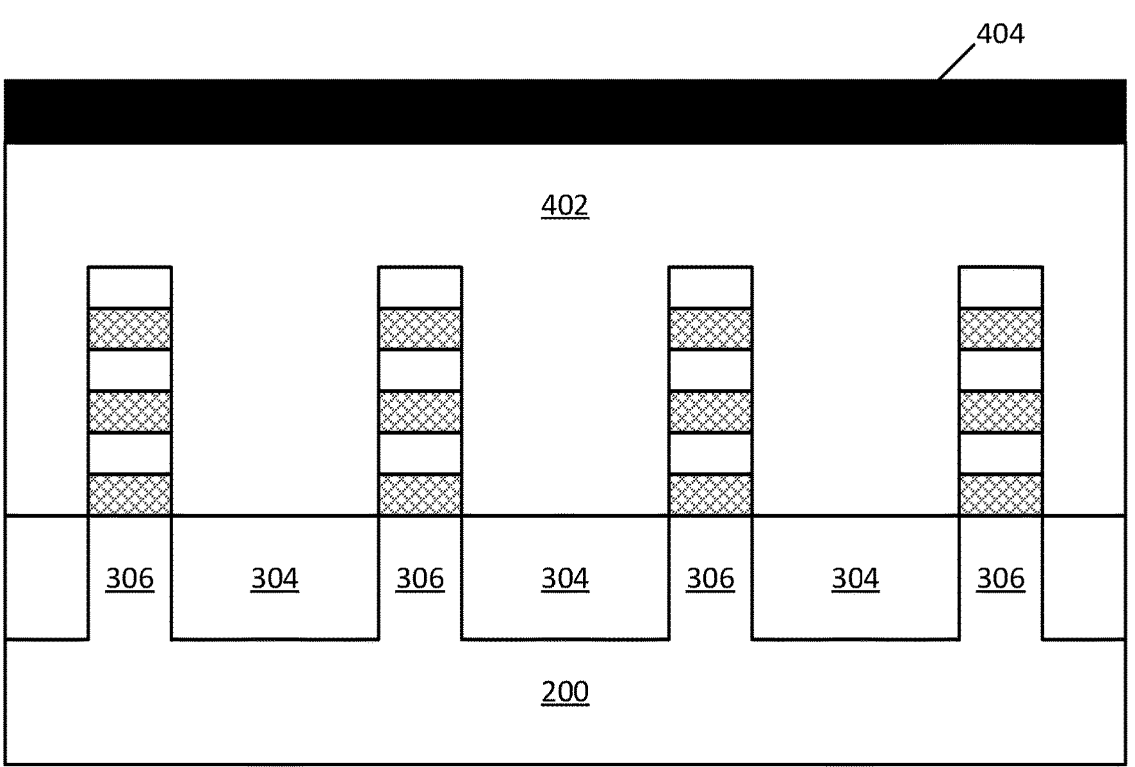
FIGS. 4A and 4B are cross-sectional and plan views, respectively, that illustrate another stage in the example process for forming an integrated circuit configured with a grid of gate cut structures, in accordance with an embodiment of the present disclosure.
Figure 4B:
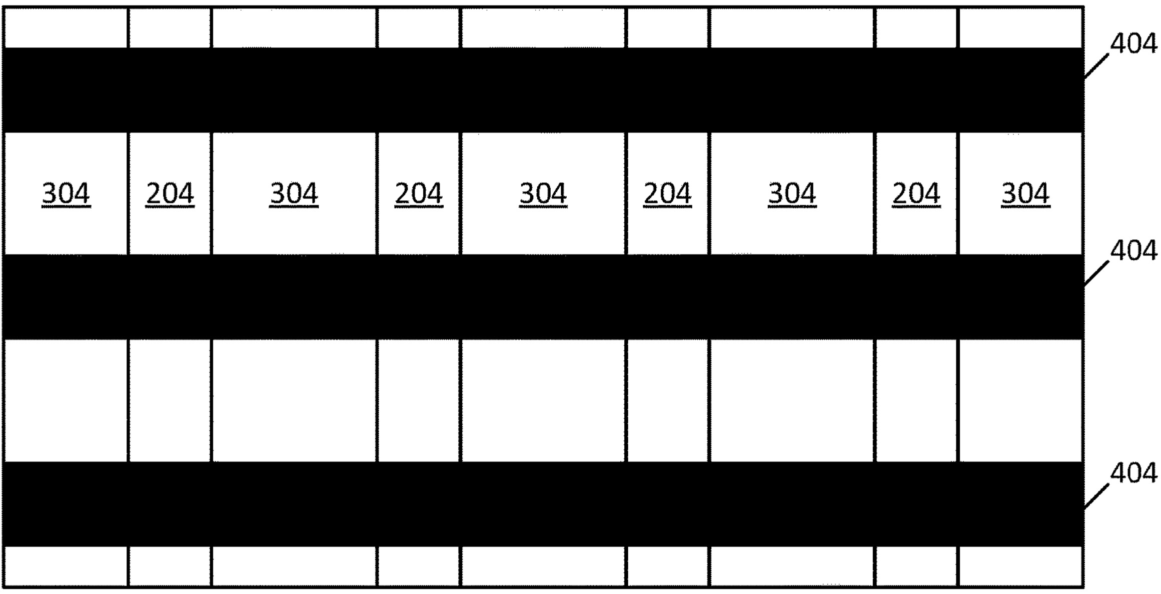

FIGS. 4A and 4B depict the cross-section and plan views of the structure shown in FIGS. 3A and 3B, respectively, following the formation of a sacrificial gate 402 beneath a corresponding gate masking layer 404, according to some embodiments. Gate masking layers 404 may be patterned in strips that extend orthogonally across each of the fins in order to form corresponding sacrificial gates 402 in strips beneath the gate masking layers 404. According to some embodiments, the sacrificial gate material is removed in all areas not protected by gate masking layers 404. Gate masking layer 404 may be any suitable hard mask material such as CHM or silicon nitride. Sacrificial gate 402 may be any suitable material that can be selectively removed without damaging the semiconductor material of the fins. In some examples, sacrificial gate 402 includes polysilicon.

Figure 5A:
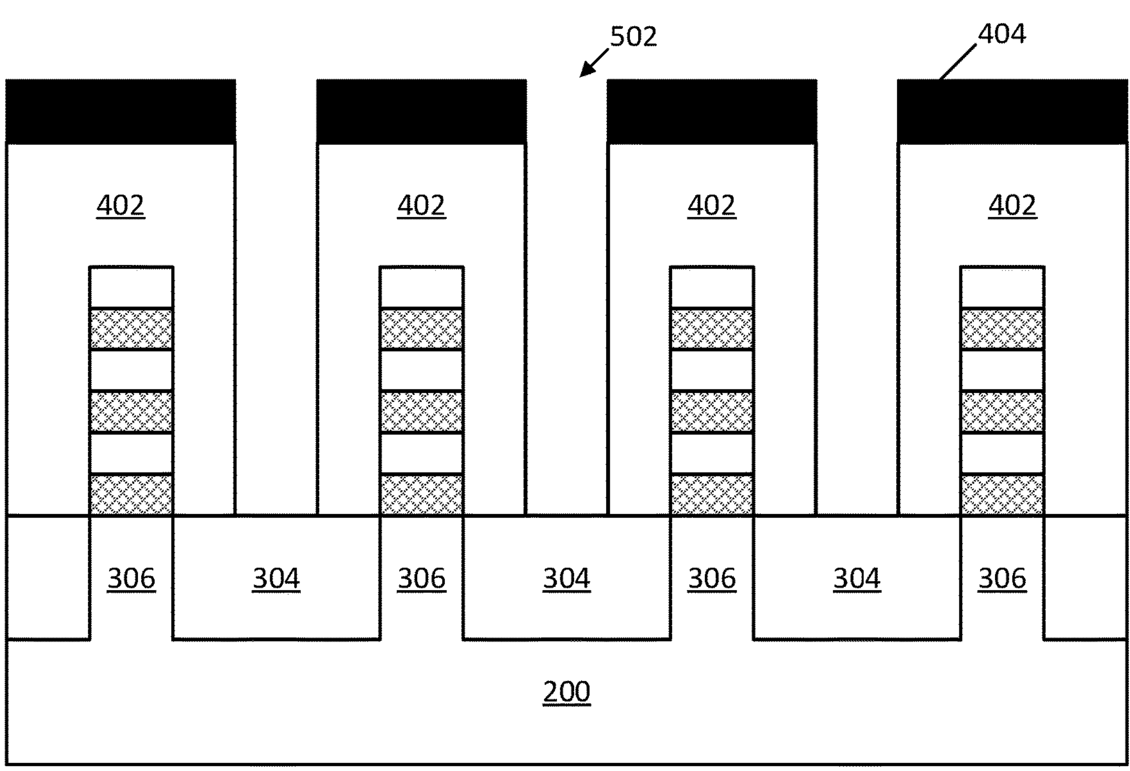
FIGS. 5A and 5B are cross-sectional and plan views, respectively, that illustrate another stage in the example process for forming an integrated circuit configured with a grid of gate cut structures, in accordance with an embodiment of the present disclosure.
Figure 5B:
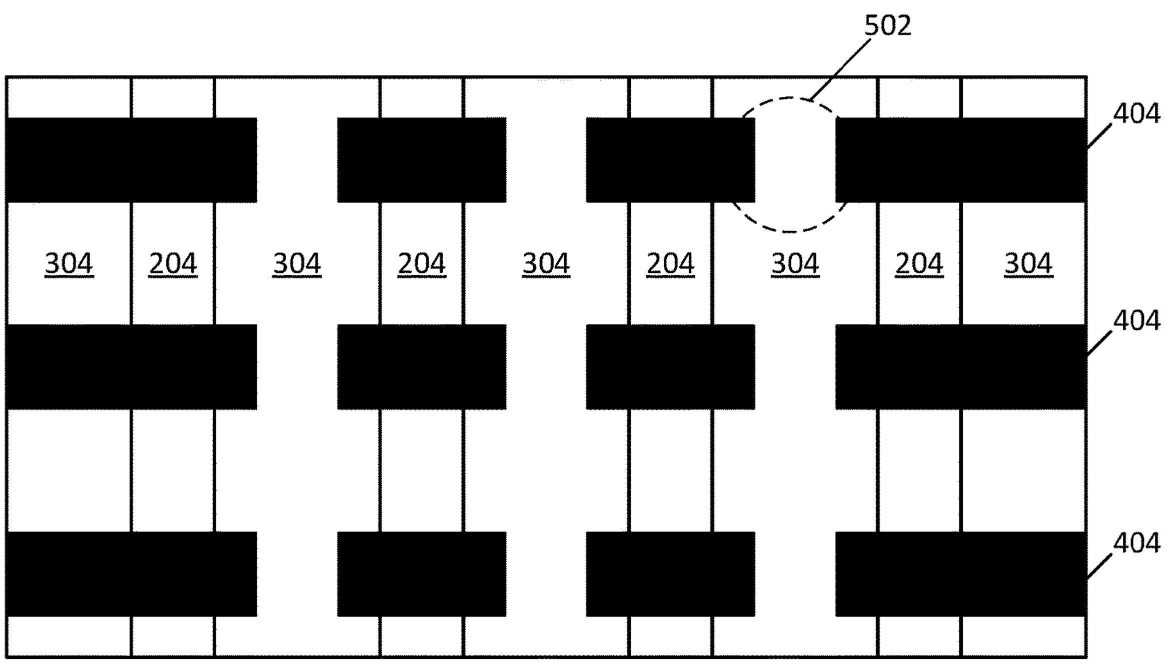

FIGS. 5A and 5B depict the cross-section and plan views of the structure shown in FIGS. 4A and 4B, respectively, following the removal of portions of sacrificial gate 402 between each adjacent pair of fins, according to some embodiments. Openings 502 are formed along each sacrificial gate 402 strip between each pair of fins. According to some embodiments, the fins run lengthwise in a first direction while the sacrificial gates run lengthwise in a second direction orthogonal to the first direction. Accordingly, openings 502 may be formed in a grid-like pattern across the integrated circuit, which allows for a simple masking procedure to take place (e.g., only parallel masking strips are needed). Sacrificial gate 402 and gate masking layer 404 may be removed together using any suitable anisotropic etching process, such as reactive ion etching (RIE).

In some embodiments, openings 502 are aligned such that they are equidistant from the adjacent fins in the second direction. In other embodiments, the exact alignment of openings 502 between the fins is not critical. In some specific examples, openings 502 have a critical dimension between about 10 nm and about 15 nm in the second direction.

Figure 6A:
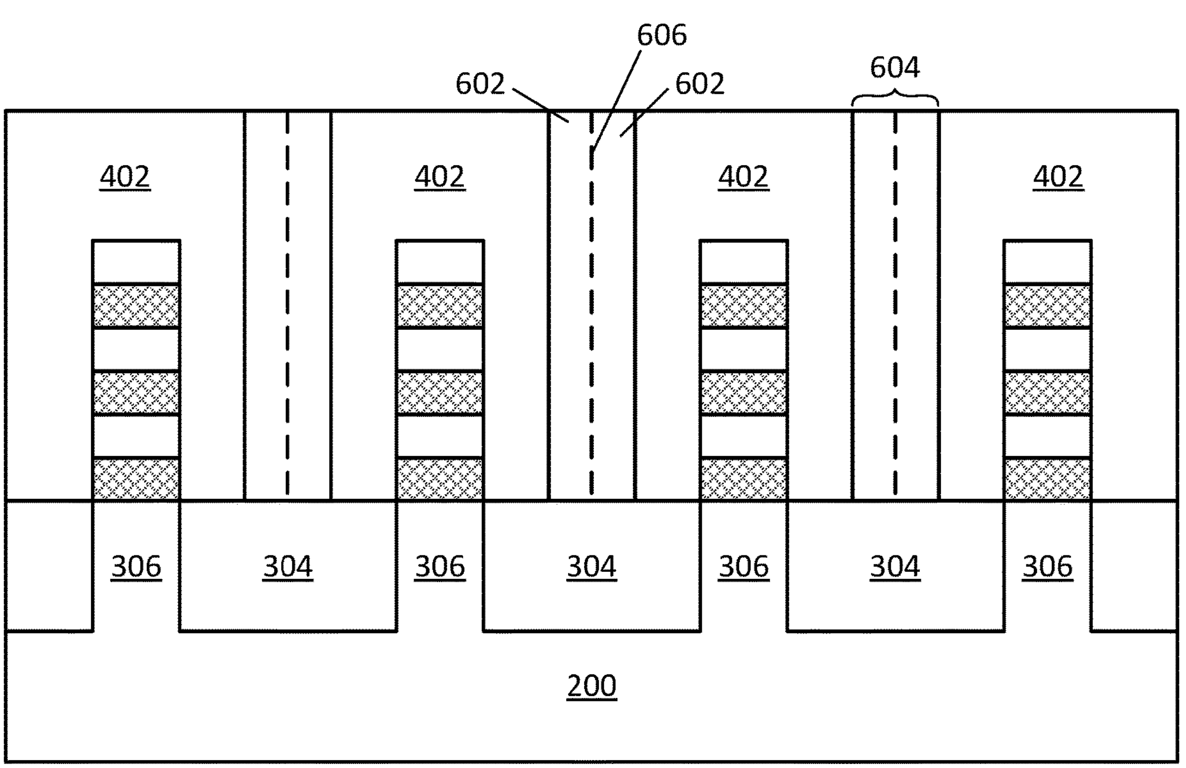
FIGS. 6A and 6B are cross-sectional and plan views, respectively, that illustrate another stage in the example process for forming an integrated circuit configured with a grid of gate cut structures, in accordance with an embodiment of the present disclosure.
Figure 6B:
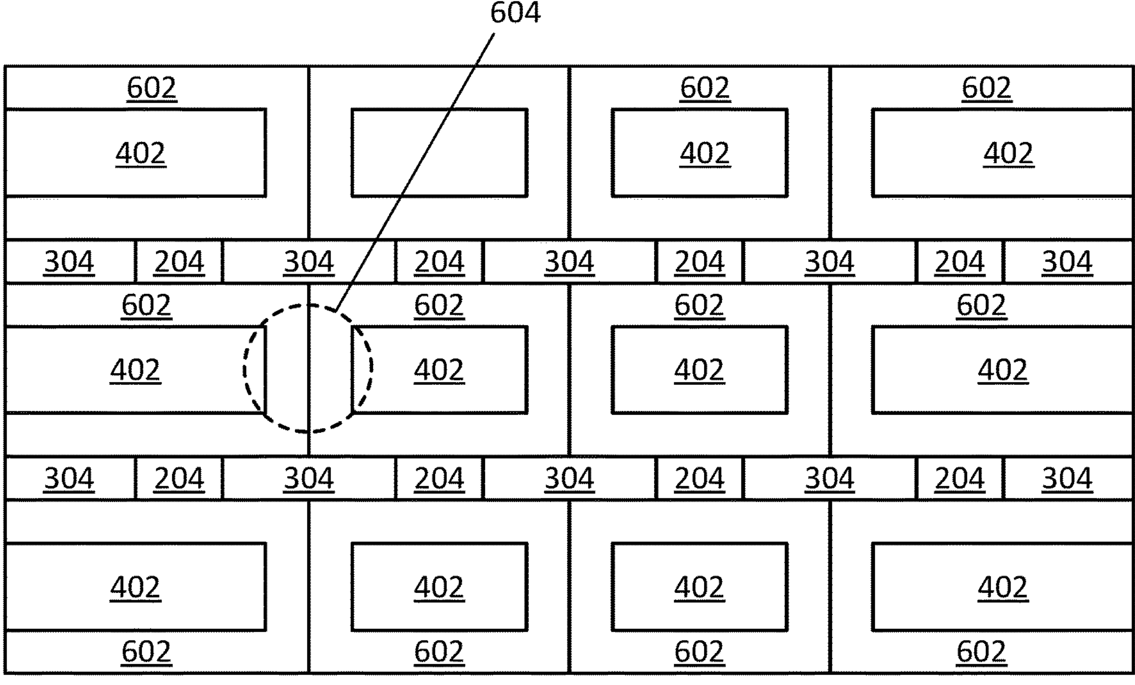
Figure 6C:
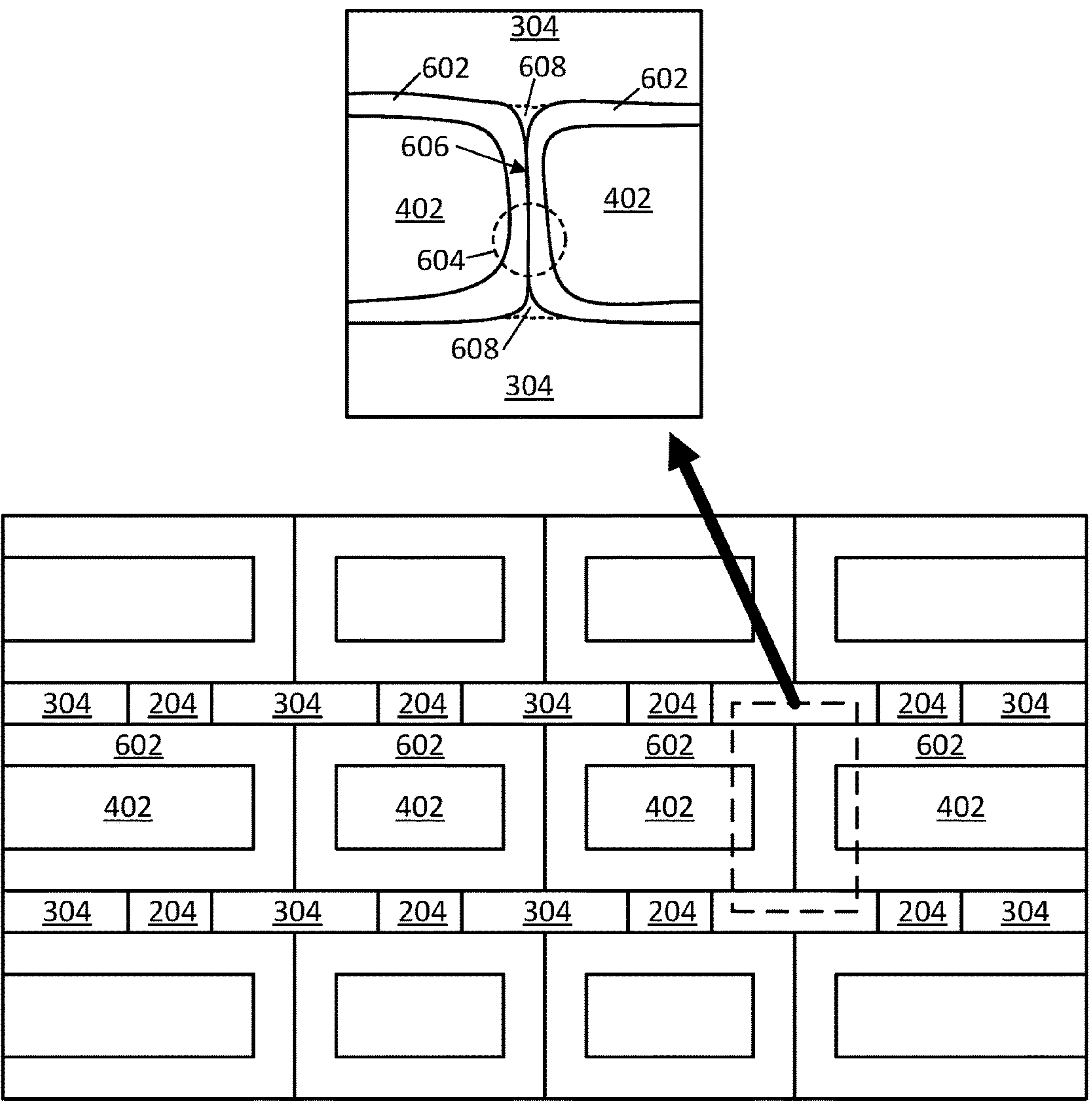
FIG. 6C is a plan view of an example gate cut structure showing its structure in more detail, in accordance with an embodiment of the present disclosure.

FIGS. 6A and 6B depict the cross-section and plan views of the structure shown in FIGS. 5A and 5B, respectively, following the formation of spacer structures 602, according to some embodiments. Spacer structures 602 may be formed along the sidewalls of sacrificial gates 402 following the removal of gate masking layers 404. In some other embodiments, gate masking layers 404 are retained above sacrificial gates 402 and the spacer structures 602 are formed along sidewalls of both sacrificial gates 402 and gate masking layers 404. Spacer structures 602 may be deposited and then etched back such that spacer structures 602 remain mostly only on sidewalls of any exposed structures. In the plan view of FIG. 6B, spacer structures 602 may also be formed along sidewalls of the exposed fins (having a top semiconductor layer 204) over dielectric layer 304. Such sidewall spacers on the fins can be removed during later processing when forming the source or drain regions. According to some embodiments, spacer structures 602 may be any suitable dielectric material, such as silicon nitride, silicon carbon nitride, or silicon oxycarbonitride. In one such embodiment, spacer structures 602 comprise a nitride and dielectric layer 304 comprises an oxide, so as to provide a degree of etch selectivity during final gate processing. Other etch selective dielectric schemes (e.g., oxide/carbide, carbide/nitride) can be used as well for spacer structures 602 and dielectric layer 304. In other embodiments, spacer structures 602 and dielectric layer 304 are compositionally the same or otherwise similar, where etch selectivity is not employed.

According to some embodiments, spacer structures 602 also form around the ends of each of the sacrificial gates 402, thus filling the space left by openings 502. The portions of spacer structures 602 that fill openings 502 form gate cut structures 604 in the same grid-like pattern attributed to openings 502. Furthermore, since spacer structures 602 are formed outwards from the surfaces of sacrificial gates 402 using, for example, a conformal deposition process like ALD or any other CVD process, spacer structures 602 will merge together within each opening 502, which may form a seam 606 where the two opposing depositions meet (as generally depicted with a dashed line in FIG. 6A), according to some embodiments. FIG. 6C illustrates the plan view of FIG. 6B highlighting one of the gate cut structures 604 formed using spacer structures 602. As can be seen from the more detailed image, spacer structures 602 form outwards from the ends of sacrificial gates 402 and merge together at 606 to form a corresponding gate cut structure 604. According to some embodiments, the formation of spacer structures 602 into opening 502 causes spacer structures 602 to pinch inwards, as generally shown at locations 608. Pinched-in or dimple regions 608 may be observed in the spacer structures 602 as they wrap around the ends of sacrificial gates 402. Note that such regions 608 may remain unfilled and be detectable voids within the finished integrated circuit. In such cases, note that the void may include gas (e.g., air or one or more process gasses) or be devoid of any gas (vacuum). Alternatively, regions 608 may be subsequently filled, such as with dielectric material 704 as will be explained in turn. In any such cases, the dimpled profile, whether partially filled, completely filled or unfilled, may be detectable in the finished integrated circuit.

Figure 7A:
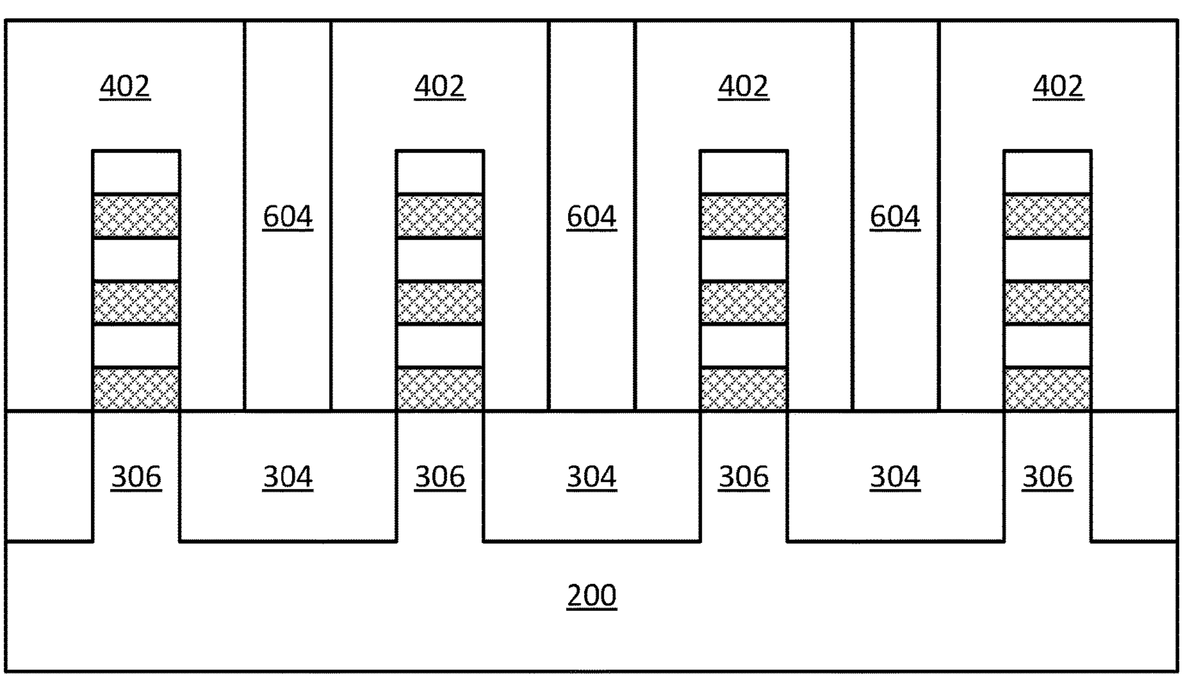
FIGS. 7A and 7B are cross-sectional and plan views, respectively, that illustrate another stage in the example process for forming an integrated circuit configured with a grid of gate cut structures, in accordance with an embodiment of the present disclosure.
Figure 7B:
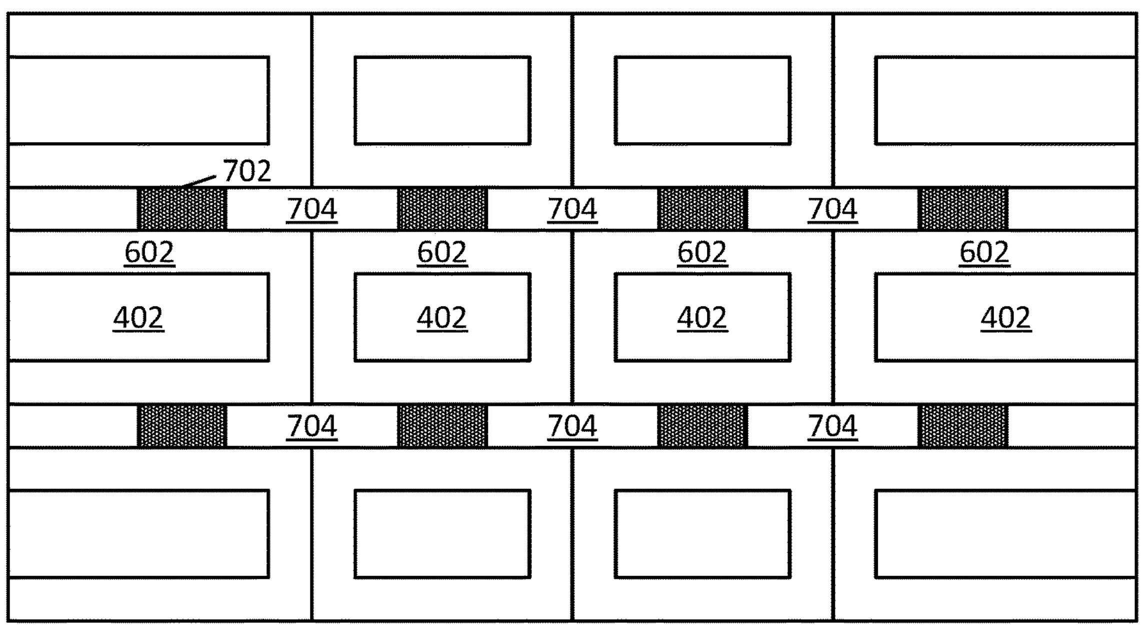

FIGS. 7A and 7B depict the cross-section and plan views of the structure shown in FIGS. 6A and 6B, respectively, following the formation of source or drain regions 702, according to some embodiments. In more detail, and according to an example, exposed portions of the fins between spacer structures 602 are removed. The exposed fin portions may be removed using any anisotropic etching process, such as reactive ion etching (RIE). Once the exposed fins have been removed, source or drain regions 702 may be formed in the areas that had been previously occupied by the exposed fins between spacer structures 602. According to some embodiments, source or drain regions 702 are epitaxially grown from the exposed semiconductor material of the fins (or nanoribbons, nanowires or nanosheets, as the case may be) along the exterior walls of spacer structures 602. In some example embodiments, source or drain regions 702 are NMOS source or drain regions (e.g., epitaxial silicon) or PMOS source or drain regions (e.g., epitaxial SiGe).

According to some embodiments, a dielectric fill 704 is provided between adjacent source or drain regions 702. Dielectric fill 704 may be any suitable dielectric material, such as silicon oxide. In some examples, dielectric fill 704 also extends over a top surface of source or drain regions 702 (e.g., up to and planar with a top surface of spacer structures 602). One or more conductive contacts may be formed at a later time through dielectric fill 704 to provide electrical contact to source or drain regions 702. For the remaining figures, dielectric fill 704 is only illustrated adjacent to source or drain regions 702 so that they are visible in the plan view. Note that dielectric fill 704 may partially or completely fill dimple regions 608.

Figure 8A:
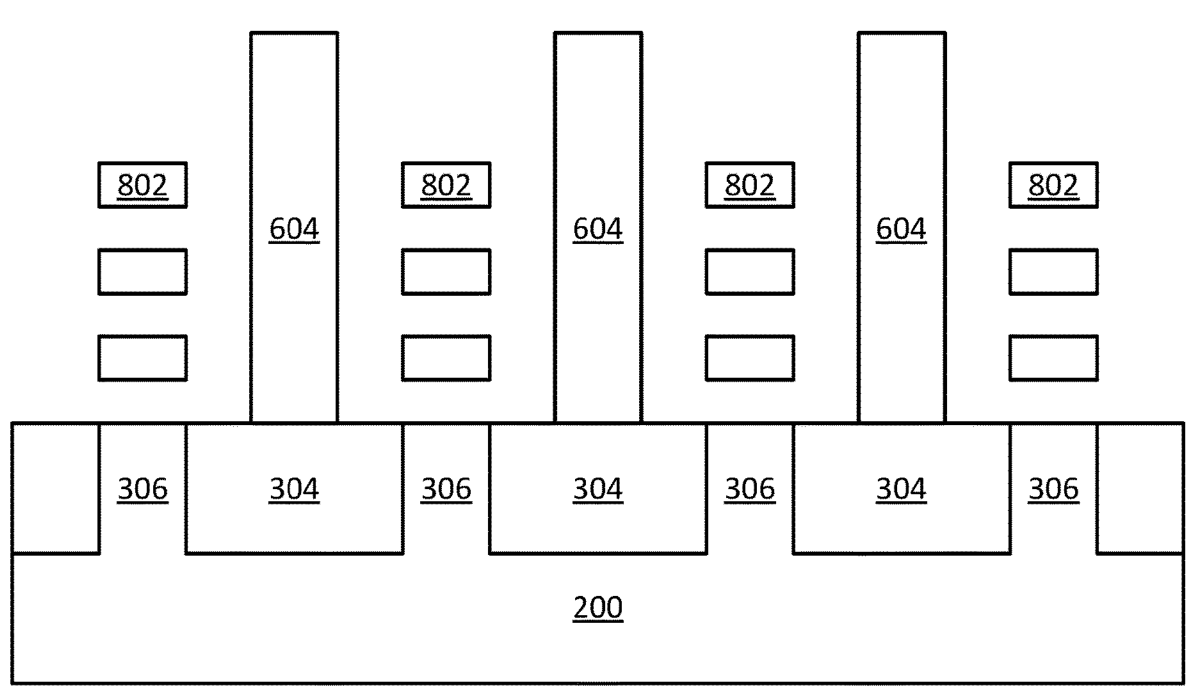
FIGS. 8A and 8B are cross-sectional and plan views, respectively, that illustrate another stage in the example process for forming an integrated circuit configured with a grid of gate cut structures, in accordance with an embodiment of the present disclosure.
Figure 8B:
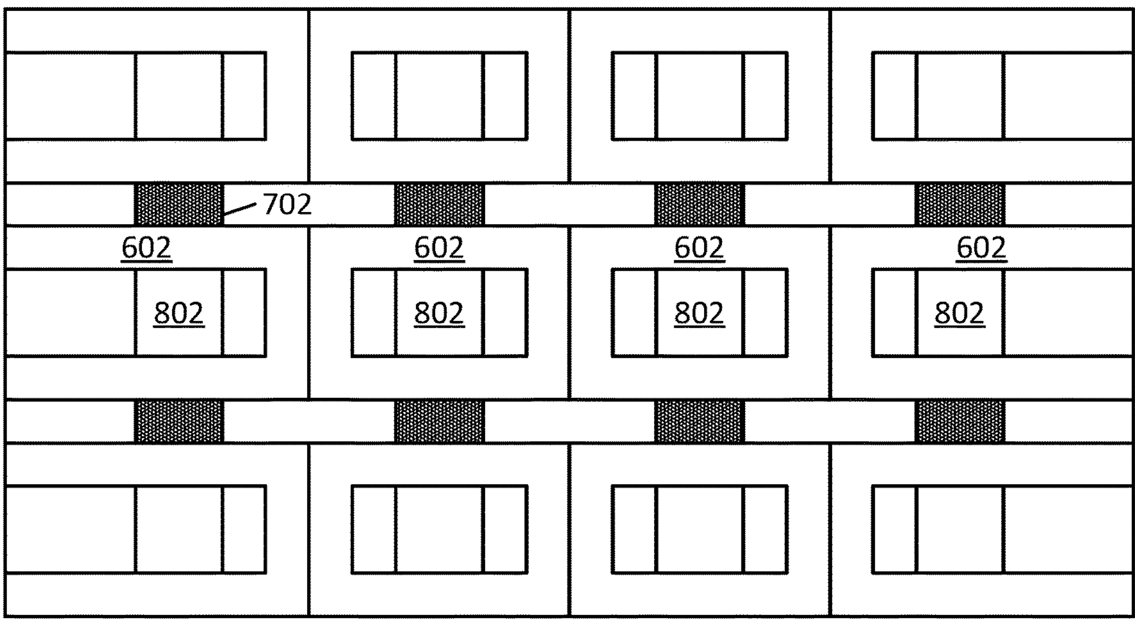

FIGS. 8A and 8B depict the cross-section and plan views of the structure shown in FIGS. 7A and 7B, respectively, following the removal of sacrificial gates 402 and sacrificial layers 202, according to some embodiments. In examples where gate masking layers 404 are still present, they would be removed at this time. Once sacrificial gates 402 are removed, the fins extending between spacer structures 602 are exposed.

In the example where the fins include alternating semiconductor layers, sacrificial layers 202 are selectively removed to leave behind nanoribbons 802 that extend between corresponding source or drain regions 702. Each vertical set of nanoribbons 802 represents the semiconductor region of a different semiconductor device. It should be understood that nanoribbons 802 may also be nanowires or nanosheets. Gate cut structures 604 remain between each adjacent semiconductor device following the removal of sacrificial gates 402. Sacrificial gates 402 and sacrificial layers 202 may be removed using the same isotropic etching process or different isotropic etching processes.

Figure 9A:
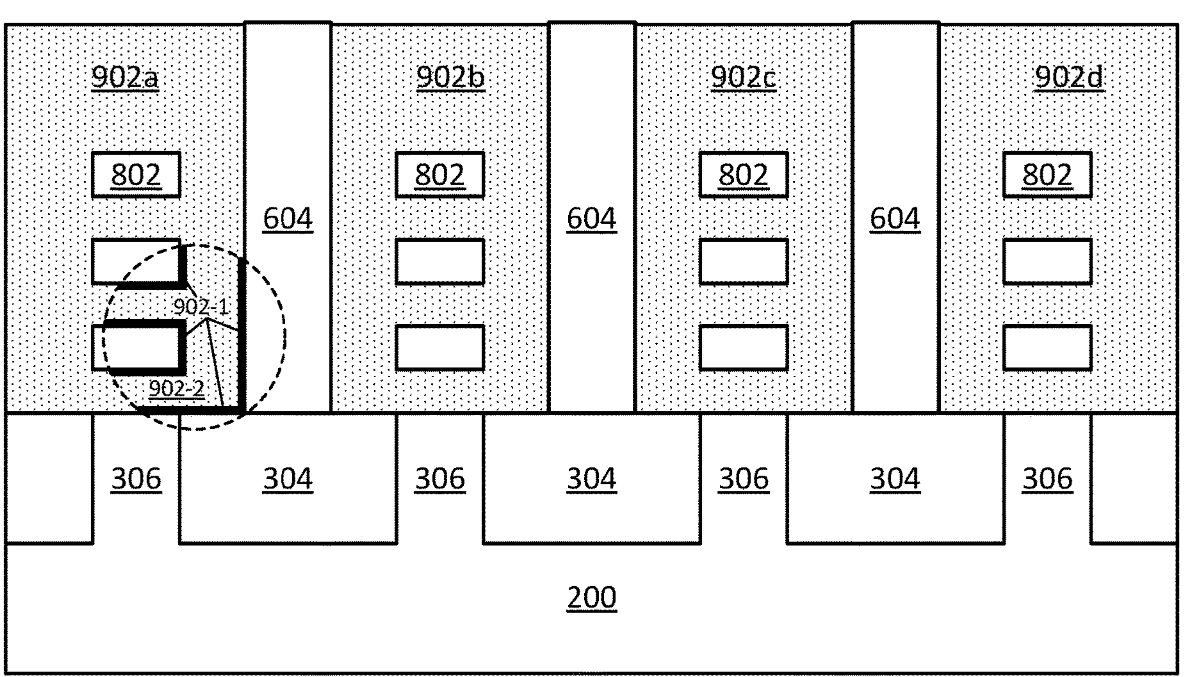
FIGS. 9A and 9B are cross-sectional and plan views, respectively, that illustrate another stage in the example process for forming an integrated circuit configured with a grid of gate cut structures, in accordance with an embodiment of the present disclosure.
Figure 9B:
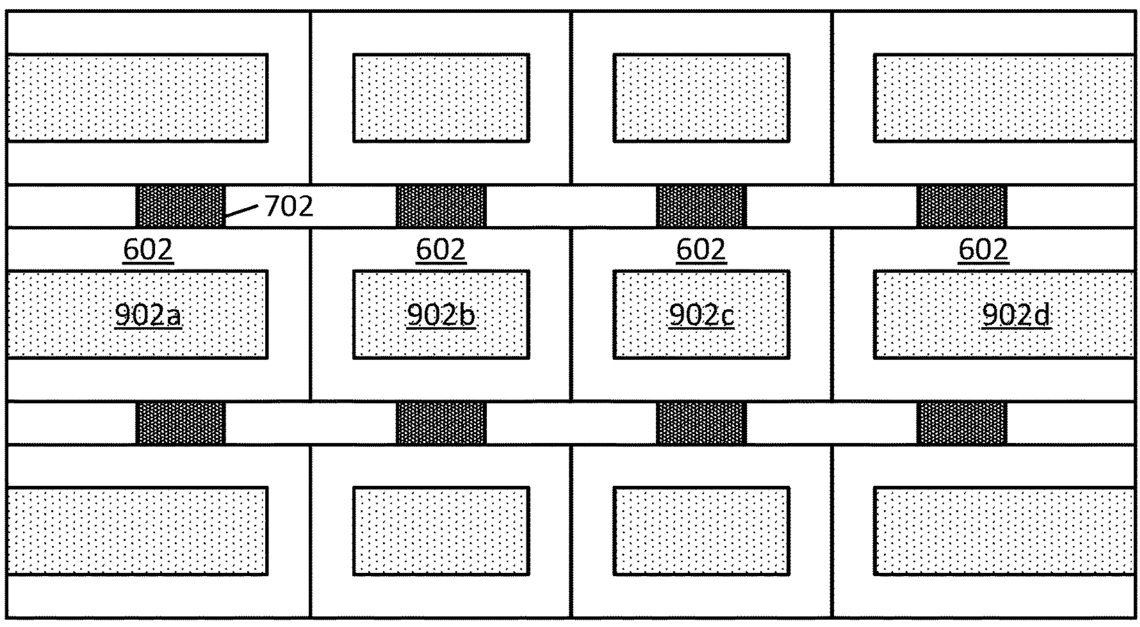

FIGS. 9A and 9B depict the cross-section and plan views of the structure shown in FIGS. 8A and 8B, respectively, following the formation of gate structures 902*a*-902*d* and subsequent polishing, according to some embodiments. As can be seen with the expanded view in the dashed circle of FIG. 9A, each gate structure includes a gate dielectric 902-1 and at least one conductive gate layer 902-2. Gate dielectric 902-1 may be first formed around nanoribbons 802 prior to the formation of the conductive gate layer 902-2. The gate dielectric 902-1 may include any suitable dielectric material (such as silicon dioxide, and/or a high-k dielectric material). Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. According to some embodiments, gate dielectric 902-1 includes a layer of hafnium oxide with a thickness between about 1 nm and about 5 nm. In some embodiments, gate dielectric 902-1 may include one or more silicates (e.g., titanium silicate, tungsten silicate, niobium silicate, and silicates of other transition metals). In some cases, gate dielectric 902-1 may include a first layer on nanoribbons 802, and a second layer on the first layer. The first layer can be, for instance, an oxide of the semiconductor material of nanoribbons 802 (e.g., silicon dioxide) and the second layer can be a high-k dielectric material (e.g., hafnium oxide). As can be further seen in the dashed circle, and according to some embodiments, gate dielectric 902-1 forms along all surfaces exposed within the gate trench between spacer structures 602, such as on the top surfaces of dielectric layer 304 and subfins 306, and along inner sidewalls of spacer structures 602 (including along sides of gate cut structures 604). Accordingly, one sidewall of a given gate cut structure 604 can contact a first gate dielectric from a first gate structure and the opposite sidewall of the given gate cut structure 604 can contact a second gate dielectric from a second gate structure adjacent to the first gate structure along the second direction. Further note that such a configuration indicates that gate structures 902*a*-902*d* are formed after gate cut structures 604.

The at least one conductive gate layer 902-2 may be deposited using electroplating, electroless plating, CVD, PECVD, ALD, or PVD, to name a few examples. In some embodiments, gate layer 902-2 includes doped polysilicon, a metal, or a metal alloy. Example suitable metals or metal alloys include aluminum, tungsten, cobalt, molybdenum, ruthenium, titanium, tantalum, copper, and carbides and nitrides thereof. Gate layer 902-2 may include, for instance, a metal fill material along with one or more workfunction layers, resistance-reducing layers, and/or barrier layers. The workfunction layers can include, for example, p-type workfunction materials (e.g., titanium nitride) for PMOS gates, or n-type workfunction materials (e.g., titanium aluminum carbide) for NMOS gates.

According to some embodiments, each gate structure 902*a*-902*d* is formed over the semiconductor region of a single corresponding semiconductor device. Each gate structure 902*a*-902*d* may be constrained over a single semiconductor device in the second direction by adjacent gate cut structures 604. Following the formation of gate structures 902*a*-902*d*, the entire structure may be polished such that the top surface of gate structures 902*a*-902*d* are planar with the top surface of at least spacer structures 602. According to some embodiments, a gate cut structure 604 is present between each adjacent pair of semiconductor devices in the second direction.

Figure 10A:
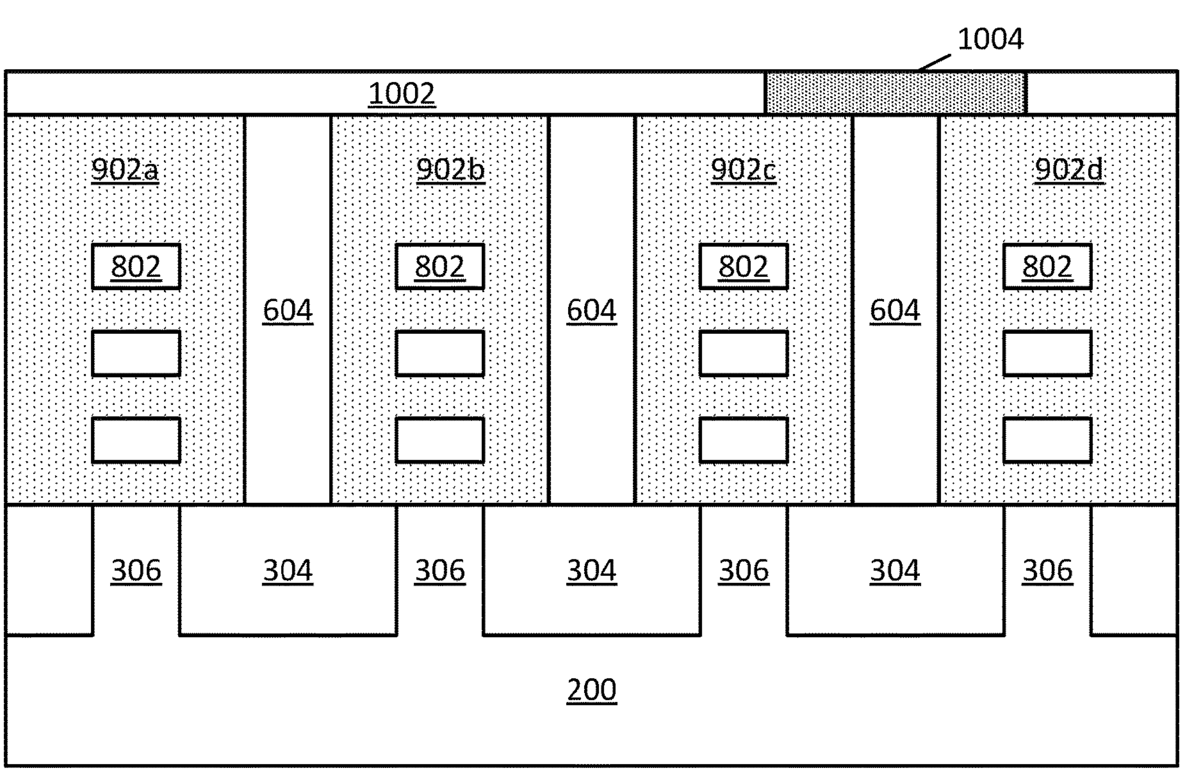
FIGS. 10A and 10B are cross-sectional and plan views, respectively, that illustrate another stage in the example process for forming an integrated circuit configured with a grid of gate cut structures, in accordance with an embodiment of the present disclosure.
Figure 10B:
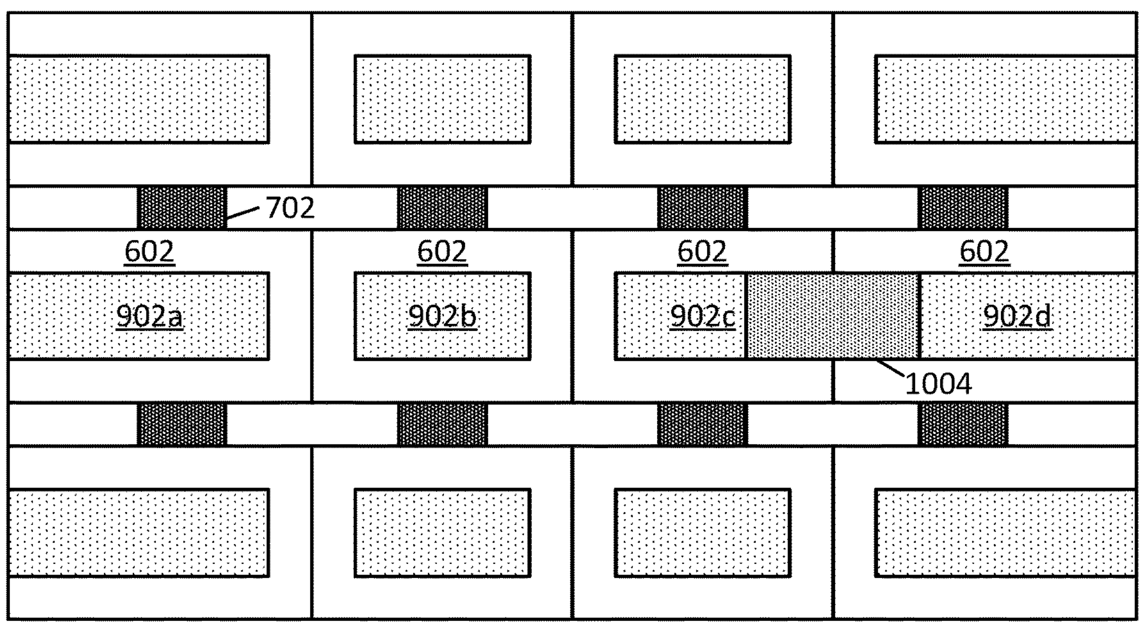

FIGS. 10A and 10B depict the cross-section and plan views of the structure shown in FIGS. 9A and 9B, respectively, following the formation of a top dielectric layer 1002 and a shunt contact 1004, according to some embodiments. In some cases, the gates of two adjacent semiconductor devices may need to be connected together. This may be a common arrangement found in many types of logic circuits. Thus, according to some embodiments, top dielectric layer 1002 may be formed over each of gate structures 902*a*-902*d* and gate cut structures 604. Top dielectric layer 1002 may be any suitable dielectric material, such as silicon oxide.

According to some embodiments, top dielectric layer 1002 may be lithographically patterned to form an opening that exposes the top surfaces of one or more gate cut structures 114 and any adjacent gate structures. A conductive shunt contact 1004 may be formed within the opening through top dielectric layer 1002 and includes any suitable conductive material to electrically connect two or more adjacent gate structures. In the illustrated example, shunt contact 1004 is formed to connect gate structure 902*c* with gate structure 902*d*. Any number of similar shunt contacts may be formed across the integrated circuit to connect adjacent gates together as desired. In some examples, shunt contact 1004 extends further to connect more than two adjacent gate structures together. It should be noted that top dielectric layer 1002 is omitted from the plan view in FIG. 10B to observe the structures below.

Figure 11:
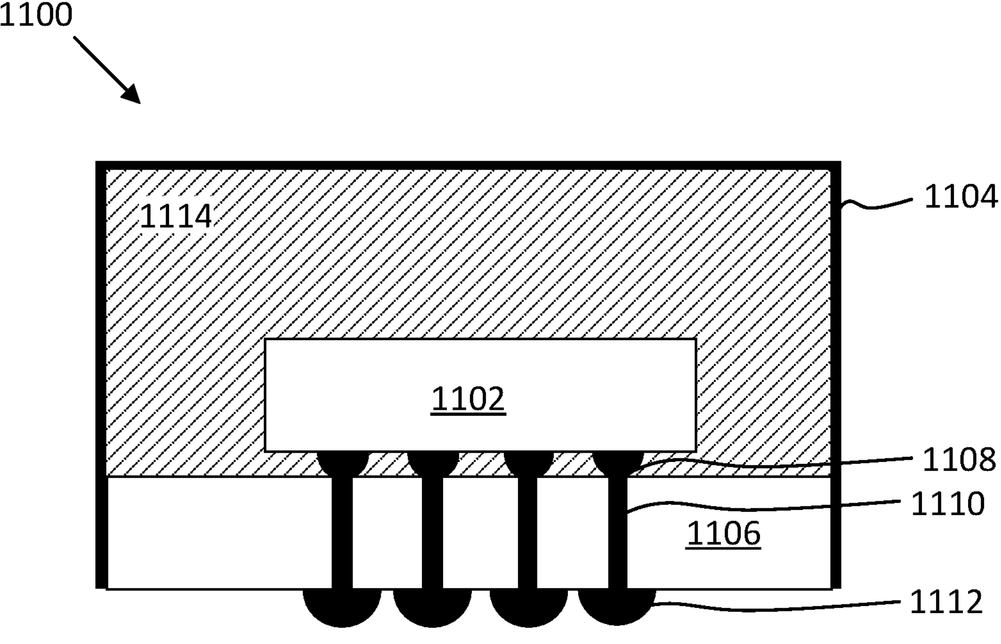
FIG. 11 illustrates a cross-section view of a chip package containing one or more semiconductor dies, in accordance with some embodiments of the present disclosure.

FIG. 11 illustrates an example embodiment of a chip package 1100, in accordance with an embodiment of the present disclosure. As can be seen, chip package 1100 includes one or more dies 1102. One or more dies 1102 may include at least one integrated circuit having semiconductor devices, such as any of the semiconductor devices disclosed herein. One or more dies 1102 may include any other circuitry used to interface with other devices formed on the dies, or other devices connected to chip package 1100, in some example configurations.

As can be further seen, chip package 1100 includes a housing 1104 that is bonded to a package substrate 1106. The housing 1104 may be any standard or proprietary housing, and may provide, for example, electromagnetic shielding and environmental protection for the components of chip package 1100. The one or more dies 1102 may be conductively coupled to a package substrate 1106 using connections 1108, which may be implemented with any number of standard or proprietary connection mechanisms, such as solder bumps, ball grid array (BGA), pins, or wire bonds, to name a few examples. Package substrate 1106 may be any standard or proprietary package substrate, but in some cases includes a dielectric material having conductive pathways (e.g., including conductive vias and lines) extending through the dielectric material between the faces of package substrate 1106, or between different locations on each face. In some embodiments, package substrate 1106 may have a thickness less than 1 millimeter (e.g., between 0.1 millimeters and 0.5 millimeters), although any number of package geometries can be used. Additional conductive contacts 1112 may be disposed at an opposite face of package substrate 1106 for conductively contacting, for instance, a printed circuit board (PCB). One or more vias 1110 extend through a thickness of package substrate 1106 to provide conductive pathways between one or more of connections 1108 to one or more of contacts 1112. Vias 1110 are illustrated as single straight columns through package substrate 1106 for ease of illustration, although other configurations can be used (e.g., damascene, dual damascene, through-silicon via, or an interconnect structure that meanders through the thickness of substrate 1106 to contact one or more intermediate locations therein). In still other embodiments, vias 1110 are fabricated by multiple smaller stacked vias, or are staggered at different locations across package substrate 1106. In the illustrated embodiment, contacts 1112 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 1112, to inhibit shorting.

In some embodiments, a mold material 1114 may be disposed around the one or more dies 1102 included within housing 1104 (e.g., between dies 1102 and package substrate 1106 as an underfill material, as well as between dies 1102 and housing 1104 as an overfill material). Although the dimensions and qualities of the mold material 1114 can vary from one embodiment to the next, in some embodiments, a thickness of mold material 1114 is less than 1 millimeter. Example materials that may be used for mold material 1114 include epoxy mold materials, as suitable. In some cases, the mold material 1114 is thermally conductive, in addition to being electrically insulating.

Methodology

Figure 12:
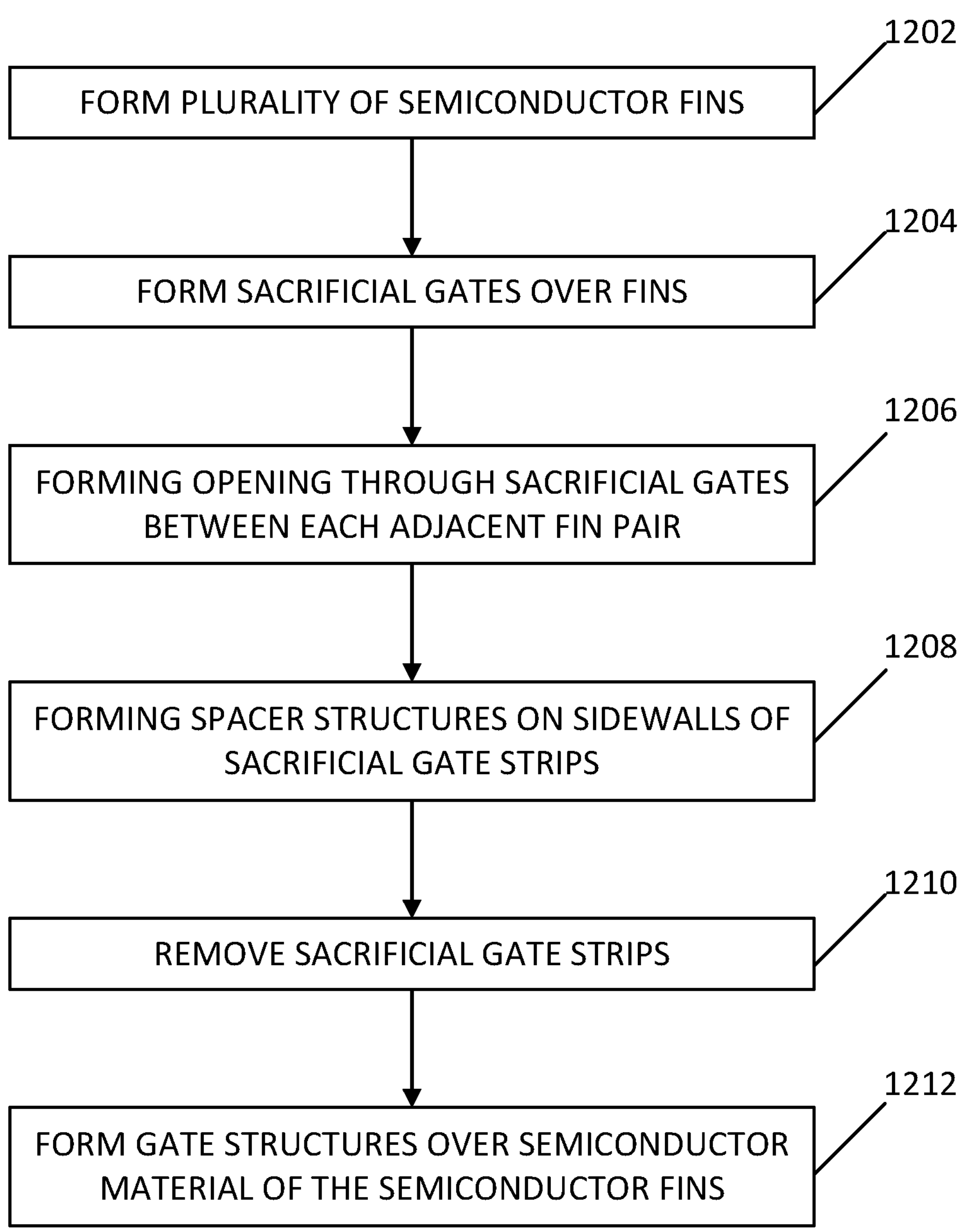
FIG. 12 is a flowchart of a fabrication process for a semiconductor device having self-aligned gate cut structures, in accordance with an embodiment of the present disclosure.

FIG. 12 is a flow chart of a method 1200 for forming at least a portion of an integrated circuit, according to an embodiment. Various operations of method 1200 may be illustrated in FIGS. 2A-10A and 2B-10B. However, the correlation of the various operations of method 1200 to the specific components illustrated in the aforementioned figures is not intended to imply any structural and/or use limitations. Rather, the aforementioned figures provide one example embodiment of method 1200. Other operations may be performed before, during, or after any of the operations of method 1200. For example, method 1200 does not explicitly describe many steps that are performed to form common transistor structures. Some of the operations of method 1200 may be performed in a different order than the illustrated order.

Method 1200 begins with operation 1202 where a plurality of parallel semiconductor fins are formed, according to some embodiments. The semiconductor material in the fins may be formed from a substrate such that the fins are an integral part of the substrate (e.g., etched from a bulk silicon substrate). Alternatively, the fins can be formed of material deposited onto an underlying substrate. In one such example case, a blanket layer of silicon germanium (SiGe) can be deposited onto a silicon substrate, and then patterned and etched to form a plurality of SiGe fins extending from that substrate. In another such example, non-native fins can be formed in a so-called aspect ratio trapping based process, where native fins are etched away so as to leave fin-shaped trenches which can then be filled with an alternative semiconductor material (e.g., group IV or III-V material). In still other embodiments, the fins include alternating layers of material (e.g., alternating layers of silicon and SiGe) that facilitates forming of nanowires and nanoribbons during a gate forming process where one type of the alternating layers are selectively etched away so as to liberate the other type of alternating layers within the channel region, so that a gate-all-around (GAA) process can then be carried out. Again, the alternating layers can be blanket deposited and then etched into fins, or deposited into fin-shaped trenches. The fins may also include a cap structure over each fin that is used to define the locations of the fins during, for example, an RIE process. The cap structure may be a dielectric material, such as silicon nitride.

Method 1200 continues with operation 1204 where sacrificial gates are formed over the fins. The sacrificial gates may be patterned using gate masking layers in strips that run orthogonally over the fins and parallel to one another (e.g., forming a cross-hatch pattern). The gate masking layers may be any suitable hard mask material, such as CHM or silicon nitride. The sacrificial gates themselves may be formed from any suitable material that can be selectively removed at a later time without damaging the semiconductor material of the fins. In one example, the sacrificial gates include polysilicon.

Method 1200 continues with operation 1206 where an opening is formed through the sacrificial gate layers between each adjacent pair of fins. The openings may be formed in a grid-like pattern across the integrated circuit, which allows for a simple masking procedure to take place (e.g., only parallel masking strips are needed). The sacrificial gates may be etched using any suitable anisotropic etching process, such as RIE. Each opening extends through at least an entire thickness of the sacrificial gate. According to some embodiments, an opening is formed in each portion of every sacrificial gate between each adjacent pair of fins.

In some embodiments, the openings are aligned such that they are equidistant from the adjacent fins in the second direction. In other embodiments, the exact alignment of openings between the fins is not critical. The openings may have a critical dimension between about 10 nm and about 15 nm in the second direction.

Method 1200 continues with operation 1208 where spacer structures are formed on sidewalls of at least the sacrificial gates. The spacer structures may be deposited and then etched back such that the spacer structures remain mostly only on sidewalls of any exposed structures. In some cases, spacer structures may also be formed along sidewalls of the exposed fins running orthogonally between the strips of sacrificial gates. According to some embodiments, the spacer structures may be any suitable dielectric material, such as silicon nitride or silicon oxynitride.

According to some embodiments, the spacer structures also form around the ends of each of the sacrificial gates, thus filling the openings formed in operation 1206. The portions of the spacer structures that fill the openings form gate cut structures in the same grid-like pattern as the openings. Furthermore, since the spacer structures are formed outwards from the surfaces of sacrificial gates 402 using, for example, a CVD process like ALD, the spacer structures merge together within each of the openings and form a seam in each of the gate cut structures, according to some embodiments. In a plan view, the spacer structures can be observed pinching inwards towards each of the gate cut structures as they form around the ends of the sacrificial gates, according to some embodiments.

Method 1200 continues with operation 1210 where the sacrificial gates are removed. The sacrificial gates may be removed using an isotropic etching process that selectively removes all of the material from the sacrificial gates, thus exposing the various fins between sets of spacer structures. In the example case where GAA transistors are used, any sacrificial layers within the exposed fins between the spacer structures may also be removed to leave behind nanoribbons, nanosheets, or nanowires of semiconductor material.

Method 1200 continues with operation 1212 where gate structures are formed over the semiconductor material of the various semiconductor fins. The gate structures may each include both a gate dielectric and a gate layer. The gate dielectric is first formed over the exposed semiconductor regions between the spacer structures followed by forming the gate layer within the remainder of the trench between the spacer structures, according to some embodiments. The gate dielectric may include any number of dielectric layers deposited using a CVD process, such as ALD. The gate layer can include any conductive material, such as a metal, metal alloy, or polysilicon. The gate layer may be deposited using electroplating, electroless plating, CVD, ALD, PECVD, or PVD, to name a few examples.

According to some embodiments, each of the gate structures is formed over a semiconductor region of only a single semiconductor device. Each of the gate structures may be constrained over a single semiconductor device in the second direction by adjacent gate cut structures. Following the formation of the gate structures, the entire structure may be polished such that the top surface of the gate structures is planar with the top surface of at least the spacer structures. According to some embodiments, a gate cut structure is present between each adjacent pair of semiconductor devices in the second direction.

Example System

Figure 13:
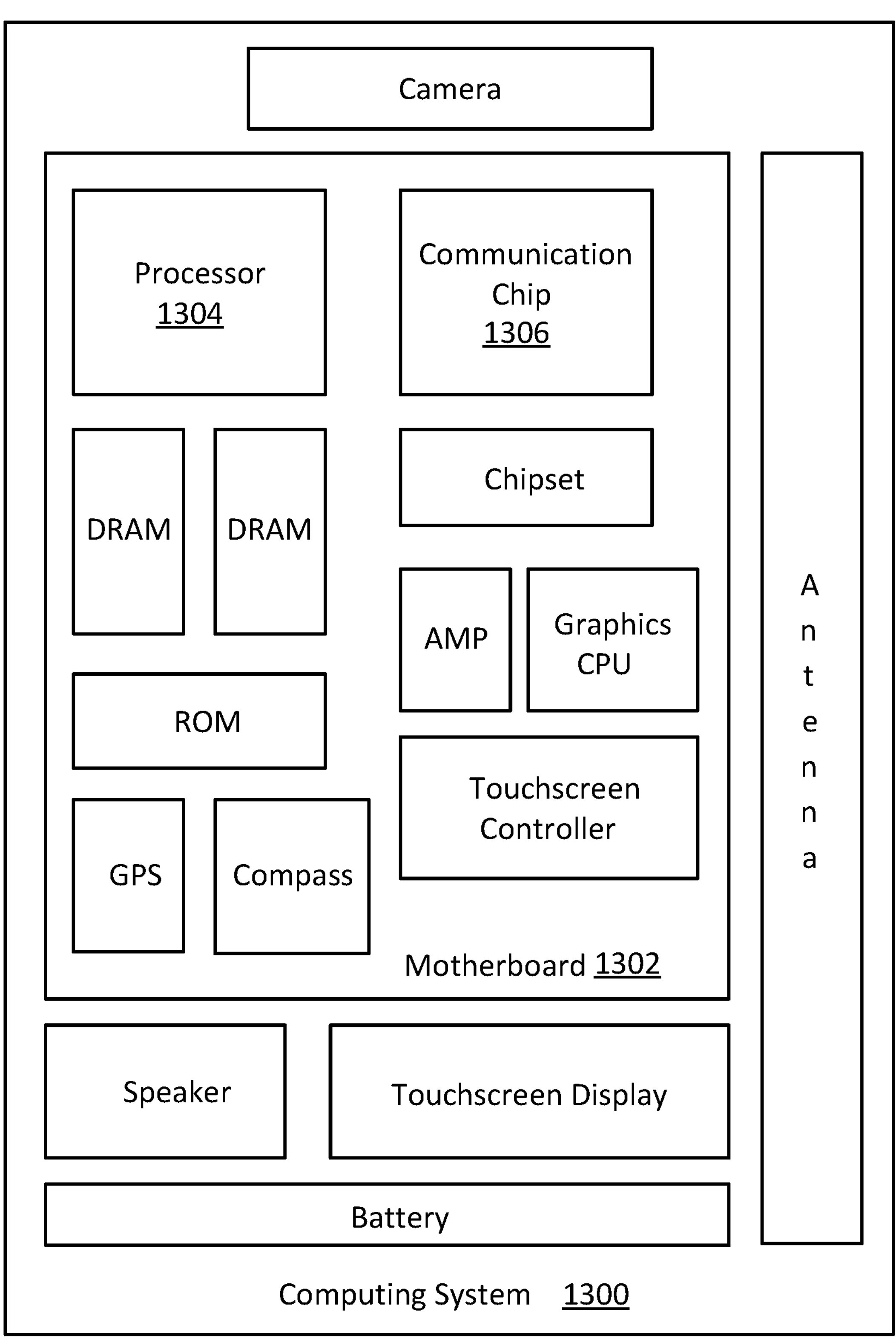
FIG. 13 illustrates a computing system including one or more integrated circuits, as variously described herein, in accordance with an embodiment of the present disclosure.

FIG. 13 is an example computing system implemented with one or more of the integrated circuit structures as disclosed herein, in accordance with some embodiments of the present disclosure. As can be seen, the computing system 1300 houses a motherboard 1302. The motherboard 1302 may include a number of components, including, but not limited to, a processor 1304 and at least one communication chip 1306, each of which can be physically and electrically coupled to the motherboard 1302, or otherwise integrated therein. As will be appreciated, the motherboard 1302 may be, for example, any printed circuit board (PCB), whether a main board, a daughterboard mounted on a main board, or the only board of system 1300, etc.

Depending on its applications, computing system 1300 may include one or more other components that may or may not be physically and electrically coupled to the motherboard 1302. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1300 may include one or more integrated circuit structures or devices configured in accordance with an example embodiment (e.g., a module including an integrated circuit device on a substrate, the substrate having one or more semiconductor devices with gate cut structures present between each adjacent pair of semiconductor devices, as variously provided herein). In some embodiments, multiple functions can be integrated into one or more chips (e.g., for instance, note that the communication chip 1306 can be part of or otherwise integrated into the processor 1304).

The communication chip 1306 enables wireless communications for the transfer of data to and from the computing system 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1306 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1300 may include a plurality of communication chips 1306. For instance, a first communication chip 1306 may be dedicated to shorter range wireless communications such as Wi-Fi and Bluetooth and a second communication chip 1306 may be dedicated to longer range wireless communications such as GPS, EDGE, GPRS, CDMA, WiMAX, LTE, Ev-DO, and others.

The processor 1304 of the computing system 1300 includes an integrated circuit die packaged within the processor 1304. In some embodiments, the integrated circuit die of the processor includes onboard circuitry that is implemented with one or more semiconductor devices as variously described herein. The term "processor" may refer to any device or portion of a device that processes, for instance, electronic data from registers and/or memory to transform that electronic data into other electronic data that may be stored in registers and/or memory.

The communication chip 1306 also may include an integrated circuit die packaged within the communication chip 1306. In accordance with some such example embodiments, the integrated circuit die of the communication chip includes one or more semiconductor devices as variously described herein. As will be appreciated in light of this disclosure, note that multi-standard wireless capability may be integrated directly into the processor 1304 (e.g., where functionality of any chips 1306 is integrated into processor 1304, rather than having separate communication chips). Further note that processor 1304 may be a chip set having such wireless capability. In short, any number of processor 1304 and/or communication chips 1306 can be used. Likewise, any one chip or chip set can have multiple functions integrated therein.

In various implementations, the computing system 1300 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

It will be appreciated that in some embodiments, the various components of the computing system 1300 may be combined or integrated in a system-on-a-chip (SoC) architecture. In some embodiments, the components may be hardware components, firmware components, software components or any suitable combination of hardware, firmware or software.

FURTHER EXAMPLE EMBODIMENTS

The following examples pertain to further embodiments, from which numerous permutations and configurations will be apparent.

Example 1 is an integrated circuit that includes a first semiconductor device having a first semiconductor body extending in a first direction between a first source region and a first drain region, a second semiconductor device having a second semiconductor body extending in the first direction parallel to the first semiconductor body between a second source region and a second drain region, a first gate structure extending across the first semiconductor body in a second direction different from the first direction, a second gate structure extending across the second semiconductor body in the second direction, a first spacer structure along sidewalls of the first gate structure, and a second spacer structure along sidewalls of the second gate structure. The first and second spacer structures wrap around ends of the first and second gate structures, respectively, to form a gate cut structure between the first gate structure and the second gate structure.

Example 2 includes the subject matter of Example 1, wherein the first semiconductor body and the second semiconductor body each comprises a plurality of semiconductor nanoribbons.

Example 3 includes the subject matter of Example 2, wherein the plurality of semiconductor nanoribbons comprise germanium, silicon, or a combination thereof.

Example 4 includes the subject matter of any one of Examples 1-3, wherein the first gate structure comprises a first gate dielectric layer around the first semiconductor body and the second gate structure comprises a second gate dielectric layer around the second semiconductor body.

Example 5 includes the subject matter of Example 4, wherein the first gate dielectric layer is present on a first sidewall of the gate cut structure and the second gate dielectric layer is present on a second sidewall of the gate cut structure.

Example 6 includes the subject matter of any one of Examples 1-5, wherein the gate cut structure is a first gate cut structure, and the first and second gate structures are collinear with each other and provide a first gate structure pair, the integrated circuit comprising a second gate structure pair including a third gate structure and a fourth gate structure, the third and fourth gate structures collinear with each other as well as the first and second gate structures, a second gate cut structure between the first gate structure pair and the second gate structure pair, and a third gate cut structure between the third gate structure and the fourth gate structure.

Example 7 includes the subject matter of any one of Examples 1-6, further comprising a conductive layer over a top surface of the gate cut structure, the conductive layer in contact with each of the first gate structure and the second gate structure.

Example 8 includes the subject matter of any one of Examples 1-7, wherein the first and second spacer structures pinch inwards towards the gate cut structure.

Example 9 includes the subject matter of any one of Examples 1-8, wherein the gate cut structure has a dimpled or pinched-in profile.

Example 10 includes the subject matter of any one of Examples 1-9, comprising dielectric fill material that extends into dimpled or pinched-in regions of the gate cut structure.

Example 11 includes the subject matter of Example 10, wherein the dielectric fill material is compositionally distinct from the gate cut structure.

Example 12 includes the subject matter of any one of Examples 1-11, comprising one or more voids that extend into a dimpled or pinched-in region of the gate cut structure.

Example 13 includes the subject matter of Example 12, wherein the one or more voids are filled with one or more gasses.

Example 14 is a printed circuit board comprising the integrated circuit of any one of Examples 1-13.

Example 15 is an electronic device that includes a chip package having one or more dies. At least one of the one or more dies includes a first semiconductor device having a first semiconductor body extending in a first direction between a first source region and a first drain region, a second semiconductor device having a second semiconductor body extending in the first direction parallel to the first semiconductor body between a second source region and a second drain region, a first gate structure extending across the first semiconductor body in a second direction different from the first direction, a second gate structure extending across the second semiconductor body in the second direction, a first spacer structure along sidewalls of the first gate structure, and a second spacer structure along sidewalls of the second gate structure. The first and second spacer structures wrap around ends of the first and second gate structures, respectively, to form a gate cut structure between the first gate structure and the second gate structure.

Example 16 includes the subject matter of Example 15, wherein the first semiconductor body and the second semiconductor body each comprises a plurality of semiconductor nanoribbons.

Example 17 includes the subject matter of Example 16, wherein the plurality of semiconductor nanoribbons comprise germanium, silicon, or a combination thereof.

Example 18 includes the subject matter of any one of Examples 15-17, wherein the first gate structure comprises a first gate dielectric layer around the first semiconductor body and the second gate structure comprises a second gate dielectric layer around the second semiconductor body.

Example 19 includes the subject matter of Example 18, wherein the first gate dielectric layer is present on a first sidewall of the gate cut structure and the second gate dielectric layer is present on a second sidewall of the gate cut structure.

Example 20 includes the subject matter of any one of Examples 15-19, further comprising a conductive layer over a top surface of the gate cut structure, such that the conductive layer contacts each of the first conductive gate and the second conductive gate.

Example 21 includes the subject matter of any one of Examples 15-20, wherein the first and second spacer structures pinch inwards towards the gate cut structure.

Example 22 includes the subject matter of any one of Examples 15-21, further comprising a printed circuit board, wherein the chip package is coupled to the printed circuit board.

Example 23 is a method for forming an integrated circuit. The method includes forming a plurality of fins comprising semiconductor material extending above a top surface of a dielectric layer, the plurality of fins each extending lengthwise in a first direction; forming a strip of sacrificial gate material over the plurality of fins, the strip of sacrificial gate material extending lengthwise in a second direction different from the first direction; forming a recess through the strip of sacrificial gate material between each adjacent pair of fins of the plurality of fins, thus creating collinear strips of sacrificial gate material; forming spacer structures on sidewalls of the collinear strips of sacrificial gate material such that the spacer structures also fill each of the recesses to form dielectric barriers between each adjacent pair of fins; and replacing the collinear strips of sacrificial gate material with gate structures.

Example 24 includes the subject matter of Example 23, wherein forming the recess comprises forming the recess through the strip of sacrificial gate material between each adjacent pair of fins using a single etching process.

Example 25 includes the subject matter of Example 23 or 24, wherein the semiconductor material comprises first semiconductor layers alternating with second semiconductor layers and the method further comprises removing the second semiconductor layers to form nanoribbons from the first semiconductor layers.

Example 26 includes the subject matter of any one of Examples 23-25, wherein the second direction is orthogonal to the first direction.

Example 27 includes the subject matter of any one of Examples 23-26, wherein the gate structures are interrupted by the dielectric barriers in the second direction.

Example 28 is an integrated circuit that includes a plurality of semiconductor devices each having one or more semiconductor bodies extending in a first direction between a corresponding source region and a corresponding drain region, a plurality of gate structures, and a plurality of dielectric barriers. Each of the gate structures extends lengthwise in a second direction different from the first direction across the one or more semiconductor bodies of a corresponding semiconductor device of the plurality of semiconductor devices. Each of the dielectric barriers is arranged between a different pair of collinear adjacent gate structures along the second direction.

Example 29 includes the subject matter of Example 28, wherein the semiconductor bodies each comprise a plurality of semiconductor nanoribbons.

Example 30 includes the subject matter of Example 29, wherein the plurality of semiconductor nanoribbons comprise germanium, silicon, or a combination thereof.

Example 31 includes the subject matter of any one of Examples 28-30, further comprising a conductive layer over a top surface of a given one of the dielectric barriers, such that the conductive layer contacts a first gate structure on a first side of the given dielectric barrier and contacts a second gate structure on an opposite second side of the given dielectric barrier.

Example 32 includes the subject matter of any one of Examples 28-31, further comprising spacer structures on sidewalls of each of the plurality of gate structures, wherein a dielectric material of the spacer structures is a same dielectric material as the plurality of dielectric barriers.

Example 33 includes the subject matter of Example 32, wherein the spacer structures wrap around ends of adjacent gate structures to form a dielectric barrier between the adjacent gate structures.

Example 34 is a printed circuit board comprising the integrated circuit of any one of Examples 28-33.

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. An integrated circuit comprising:

a first semiconductor device having a first semiconductor body extending in a first direction between a first source region and a first drain region;

a second semiconductor device having a second semiconductor body extending in the first direction parallel to the first semiconductor body between a second source region and a second drain region;

a first gate structure extending across the first semiconductor body in a second direction different from the first direction;

a second gate structure extending across the second semiconductor body in the second direction colinearly with the first gate structure;

a first spacer structure along sidewalls of the first gate structure; and a second spacer structure along sidewalls of the second gate structure;

wherein the first and second spacer structures wrap around ends of the first and second gate structures, respectively, and contact one another to form a gate cut structure between the first gate structure and the second gate structure, the gate cut structure extending in a third direction along an entire height of the first semiconductor body and an entire height of the second semiconductor body.

2. The integrated circuit of claim 1, wherein the first semiconductor body and the second semiconductor body each comprises a plurality of semiconductor nanoribbons.

3. The integrated circuit of claim 1, wherein the first gate structure comprises a first gate dielectric layer around the first semiconductor body and the second gate structure comprises a second gate dielectric layer around the second semiconductor body.

4. The integrated circuit of claim 3, wherein the first gate dielectric layer is present on a first sidewall of the gate cut structure and the second gate dielectric layer is present on a second sidewall of the gate cut structure.

5. The integrated circuit of claim 1, wherein the gate cut structure is a first gate cut structure, and the first and second gate structures provide a first gate structure pair, the integrated circuit comprising:

a second gate structure pair including a third gate structure and a fourth gate structure, the third and fourth gate structures collinear with each other as well as with the first and second gate structures;

a second gate cut structure between the first gate structure pair and the second gate structure pair; and a third gate cut structure between the third gate structure and the fourth gate structure.

6. The integrated circuit of claim 1, further comprising a conductive layer over a top surface of the gate cut structure, the conductive layer in direct contact with each of the first gate structure and the second gate structure.

7. The integrated circuit of claim 1, wherein the first and second spacer structures pinch inwards to form the gate cut structure.

8. The integrated circuit of claim 1, wherein the gate cut structure has a dimpled or pinched-in profile.

9. A printed circuit board comprising the integrated circuit of claim 1.

10. An electronic device, comprising:

a chip package comprising one or more dies, at least one of the one or more dies comprising a first semiconductor device having a first semiconductor body extending in a first direction between a first source region and a first drain region;

a second semiconductor device having a second semiconductor body extending in the first direction parallel to the first semiconductor body between a second source region and a second drain region;

a first gate structure extending across the first semiconductor body in a second direction different from the first direction;

a second gate structure extending across the second semiconductor body in the second direction colinearly with the first gate structure;

a first spacer structure along sidewalls of the first gate structure; and a second spacer structure along sidewalls of the second gate structure;

wherein the first and second spacer structures wrap around ends of the first and second gate structures, respectively, and contact one another to form a gate cut structure between the first gate structure and the second gate structure, the gate cut structure extending in a third direction along an entire height of the first semiconductor body and an entire height of the second semiconductor body.

11. The electronic device of claim 10, wherein the first semiconductor body and the second semiconductor body each comprises a plurality of semiconductor nanoribbons.

12. The electronic device of claim 10, wherein the first gate structure comprises a first gate dielectric layer around the first semiconductor body and the second gate structure comprises a second gate dielectric layer around the second semiconductor body.

13. The electronic device of claim 12, wherein the first gate dielectric layer is present on a first sidewall of the gate cut structure and the second gate dielectric layer is present on a second sidewall of the gate cut structure.

14. The electronic device of claim 10, further comprising a conductive layer over a top surface of the gate cut structure, such that the conductive layer directly contacts each of the first gate structure and the second gate structure.

15. The electronic device of claim 10, wherein the first and second spacer structures pinch inwards to form the gate cut structure.

16. An integrated circuit comprising:

a plurality of semiconductor devices each having one or more semiconductor bodies extending in a first direction between a corresponding source region and a corresponding drain region;

a plurality of gate structures, each gate structure extending lengthwise in a second direction different from the first direction and around the one or more semiconductor bodies of a corresponding semiconductor device of the plurality of semiconductor devices; and a plurality of dielectric barriers, wherein each dielectric barrier is arranged between a different pair of gate structures that are collinear along the second direction, such that each dielectric barrier extends in the first direction and divides the pair of gate structures, wherein each dielectric barrier comprises a first spacer structure wrapped around an end of a first gate structure of the pair of gate structures and a second spacer structure wrapped around an end of a second gate structure of the pair of gate structures, the first spacer structure contacting the second spacer structure and the second gate structure being colinearly aligned with the first gate structure, and wherein each dielectric barrier extends in a third direction along an entire height of the one or more semiconductor bodies of corresponding adjacent semiconductor devices.

17. The integrated circuit of claim 16, wherein the semiconductor bodies each comprise a plurality of semiconductor nanoribbons.

18. The integrated circuit of claim 16, further comprising a conductive layer over a top surface of a given one of the dielectric barriers, such that the conductive layer directly contacts a first gate structure on a first side of the given dielectric barrier and directly contacts a second gate structure on an opposite second side of the given dielectric barrier.

19. The integrated circuit of claim 16, wherein the first spacer structure also extends lengthwise in the second direction along a sidewall of the first gate structure, and the second spacer structure also extends lengthwise in the second direction along a sidewall of the second gate structure.

20. The integrated circuit of claim 16, wherein the first and second spacer structures pinch inwards to form a given dielectric barrier.

* * * * *